(12) United States Patent
Nazarian et al.

(10) Patent No.: US 8,754,671 B2
(45) Date of Patent: Jun. 17, 2014

(54) FIELD PROGRAMMABLE GATE ARRAY UTILIZING TWO-TERMINAL NON-VOLATILE MEMORY

(75) Inventors: Hagop Nazarian, San Jose, CA (US); Sang Thanh Nguyen, Union City, CA (US); Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/194,479

(22) Filed: Jul. 29, 2011

(65) Prior Publication Data

US 2013/0027079 A1    Jan. 31, 2013

(51) Int. Cl.
*H03K 19/0944*    (2006.01)
*H03K 19/177*    (2006.01)
*G11C 11/00*    (2006.01)

(52) U.S. Cl.
USPC .............................. 326/41; 326/39; 365/148

(58) Field of Classification Search
USPC ............................................... 326/82, 37–50
See application file for complete search history.

(56) References Cited

U.S. PATENT DOCUMENTS

| 6,867,618 | B2 | 3/2005 | Li et al. | |
| 7,167,387 | B2 * | 1/2007 | Sugita et al. | 365/148 |
| 7,274,587 | B2 * | 9/2007 | Yasuda | 365/148 |
| 8,054,679 | B2 | 11/2011 | Nakai et al. | |
| 8,102,018 | B2 | 1/2012 | Bertin et al. | |
| 8,269,203 | B2 * | 9/2012 | Greene et al. | 257/2 |
| 8,456,892 | B2 | 6/2013 | Yasuda | |
| 8,467,226 | B2 | 6/2013 | Bedeschi et al. | |
| 2008/0043521 | A1 | 2/2008 | Liaw et al. | |
| 2010/0110767 | A1 | 5/2010 | Katoh et al. | |
| 2011/0063888 | A1 | 3/2011 | Chi et al. | |
| 2011/0122679 | A1 | 5/2011 | Chen et al. | |
| 2011/0205780 | A1 * | 8/2011 | Yasuda et al. | 365/148 |
| 2012/0075910 | A1 * | 3/2012 | Yasuda | 365/148 |
| 2012/0120712 | A1 | 5/2012 | Kawai et al. | |
| 2013/0027081 | A1 * | 1/2013 | Nazarian et al. | 326/44 |

OTHER PUBLICATIONS

Liu, M., Wang, W., rFPGA: CMOS-Nano Hybrid FPGA Using RRAM Components, IEEE/ACM International Symposium on Nanoscale Architectures, 2008, pp. 93-98.*
Liauw et al., 2012, Nonvolatile 3D-FPGA with Monolithically Stacked RRAM-Based Configuration Memory, 2012 IEEE Solid State Circuits Conference, pp. 406-408.*

(Continued)

*Primary Examiner* — Alexander H Taningco
*Assistant Examiner* — Nelson Correa
(74) *Attorney, Agent, or Firm* — Ogawa P.C.

(57) ABSTRACT

Providing for a field programmable gate array (FPGA) utilizing resistive random access memory (RRAM) technology is described herein. By way of example, the FPGA can comprise a switching block interconnect having parallel signal input lines crossed by perpendicular signal output lines. RRAM memory cells can be formed at respective intersections of the signal input lines and signal output lines. The RRAM memory cell can include a voltage divider comprising multiple programmable resistive elements arranged electrically in series across a $V_{CC}$ and $V_{SS}$ of the FPGA. A common node of the voltage divider drives a gate of a pass gate transistor configured to activate or deactivate the intersection. The disclosed RRAM memory can provide high transistor density, high logic utilization, fast programming speed, radiation immunity, fast power up and significant benefits for FPGA technology.

20 Claims, 14 Drawing Sheets

(56) References Cited

OTHER PUBLICATIONS

Miyamura, M., et al., Programmable Cell Array Using Rewritable Solid-Electrolyte Switch Integrated in 90 nm CMOS, IEEE International Solid-State Circuits Conference, 2011, pp. 228-229.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 filed on May 24, 2013.
Notice of Allowability for U.S. Appl. No. 13/651,169 dated Oct. 28, 2013.
Notice of Allowance for U.S. Appl. No. 13/194,500 dated Oct. 28, 2013.

* cited by examiner

300A

CLOSED TRANSISTOR – CONDUCTING STATE

300B

OPEN TRANSISTOR – NON-CONDUCTING STATE

FIELD PROGRAMMABLE GATE ARRAY UTILIZING TWO-TERMINAL NON-VOLATILE MEMORY

REFERENCE TO RELATED APPLICATION

The subject application for patent is related to co-pending U.S. patent application Ser. No. 13/158,231 entitled "PILLAR STRUCTURE FOR MEMORY DEVICE AND METHOD" and filed Jun. 11, 2011, assigned to the assignee hereof and hereby expressly incorporated by reference for all purposes herein.

BACKGROUND

The present disclosure relates to devices including field programmable gate arrays. A field programmable gate array (FPGA) is an integrated circuit that can be configured after manufacturing. It is a flexible device having a great number of potential configuration modes to interact with various other hardware and software designs (e.g., on a computer motherboard). The FPGA configuration is generally specified using a hardware description language, similar to that used for an application specific integrated circuit (ASIC). Generally speaking, an FPGA can be configured to implement most or all logic functions that an ASIC could execute, yet also can be at least partially reconfigured after shipping. Coupled with relatively low design costs typically associated with ASIC design, FPGAs offer significant advantages for a wide array of electronic devices and applications.

The FPGA architecture generally comprises a set of programmable logic components, or logic blocks, and reconfigurable interconnects for selectively connecting a subset of the logic blocks with other subsets thereof. Logic blocks can be configured to execute complex algorithms, or simple logic functions like AND, NAND, NOR, etc. Most FPGAs also include memory elements that can include flip-flops, memory registers, memory arrays, or the like.

Like most integrated circuits, design goals for the FPGA include reducing minimum component size, increasing calculation speed, lowering power consumption, and others. As more applications are found for these devices, demand for improved technology comes from many sectors. Although FPGAs were largely used exclusively in telecommunications and networking in early implementations, their versatility has found these devices implemented in other industries, consumer, automotive and industrial applications.

One recent development of the general FPGA architecture was to combine embedded microprocessors with the traditional logic blocks and interconnects of the FPGA. This development has lead to what are referred to as system-on-chip or system on programmable chip devices. Many examples of system-on-chip devices have emerged, generally combining processor and analog peripheral components with the FPGA architecture. The system-on-chip has enabled the miniaturization of microprocessors to achieve a new paradigm. However, as is typical with electronics technology, new paradigms very rapidly lead to applications requiring smaller, faster or lower power devices, generating new demand for research and development.

A recent innovation for integrated circuit technology has been the concept of a resistive random access memory (RRAM). In theory, RRAM is a non-volatile memory technology that induces a filament (or many filaments) in a dielectric material. In a normal state, the dielectric has high resistance, and is non-conductive. However, application of a suitable voltage across the dielectric can induce a conduction path therein. Various physical mechanisms enable generation of a conduction path in a dielectric, including defects in the material (whether natural or induced via doping), metal migration, and so on. Once the filament is formed within the dielectric, it can be activated—resulting in a low resistance conduction path through the dielectric—or deactivated—rendering the dielectric a high resistance electrical insulator—through application of a suitable program voltage. Thus, the conduction path can be referred to as a programmable conduction path, yielding similar electric characteristics as a conventional three-terminal transistor. In practice, however, the inventors of the present invention believe that the RRAM has not been commercially successful for reasons including incompatibility of RRAM fabrication materials with traditional CMOS processes, the incompatibility of RRAM processes as part of back end CMOS fabrication, and the like.

The inventors of the present invention believe that a basic memory cell architecture employing the RRAM technology could be a configuration of parallel bitlines intersected by perpendicular wordlines. A programmable resistance dielectric can be formed at the junction of each bitline and wordline. Such a basic memory cell would be referred to as a cross-point cell. One application of the RRAM cross-point cell, for instance, would be a block of reconfigurable interconnects within a FPGA. The RRAM cross-point cell may utilize RRAM memory cells of much smaller area than the comparable static random access memory (SRAM) counterpart. This reduction in area may lead to much greater component density. The RRAM cell also would have significantly lower power consumption, would be non-volatile memory (compared with volatile SRAM), radiation immune, would have quicker power-up, as well as other benefits. However, the inventors envision that the basic cross-point cell design may have large parasitic currents in non-activated memory cells, which may lead to slow read access. Moreover, the ratio of resistance in activated and deactivated states may not often be high enough for many sensitive applications, which might require such a ratio of $10^6$ or greater. Thus, the inventors believe that utilizing RRAM memory cells in conjunction with the FPGA technology may provide some benefits, additional improvements in particular areas will help to make the RRAM cross-point cell suitable for a wider range of applications.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Various aspects of the subject disclosure provide a field programmable gate array (FPGA) utilizing resistive random access memory (RRAM) technology. The FPGA can comprise a switching block interconnect having parallel signal input lines crossed by perpendicular signal output lines. A RRAM memory cell is formed at respective intersections of the signal input lines and signal output lines. The RRAM memory cell can include a voltage divider comprising multiple resistive elements arranged electrically in series across a common-collector voltage ($V_{CC}$) and source-supply voltage ($V_{SS}$) of the RRAM memory cell. A common node of the voltage divider drives a gate of a switching transistor (also referred to as a pass gate transistor) interposed between a signal input line and a signal output line at one intersection of the switching block interconnect. The pass gate transistor is therefore configured to activate or deactivate the intersection.

According to particular aspects, a voltage divider for an RRAM memory cell can comprise a pull up resistor and a pull down resistor. The pull up resistor and pull down resistor comprise programmable resistance material(s), which can be programmed to a high resistance state (non-conductive) or a low resistance state (conductive). When the pull up resistor is programmed to the low resistance state, a pass gate transistor associated with the voltage divider is activated. When the pull down resistor is programmed to the low resistance state, the pass gate transistor is deactivated. Also, the voltage divider arrangement yields fast program and erase times for switching block intersections compared to conventional approaches, such as embedded Flash memories. Moreover, the RRAM memory cell of the subject disclosure yields low power consumption, significant die-size reduction and resistance or immunity to soft errors and electromagnetic radiation errors. Accordingly, various disclosed aspects provide significant improvements in FPGA technology.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
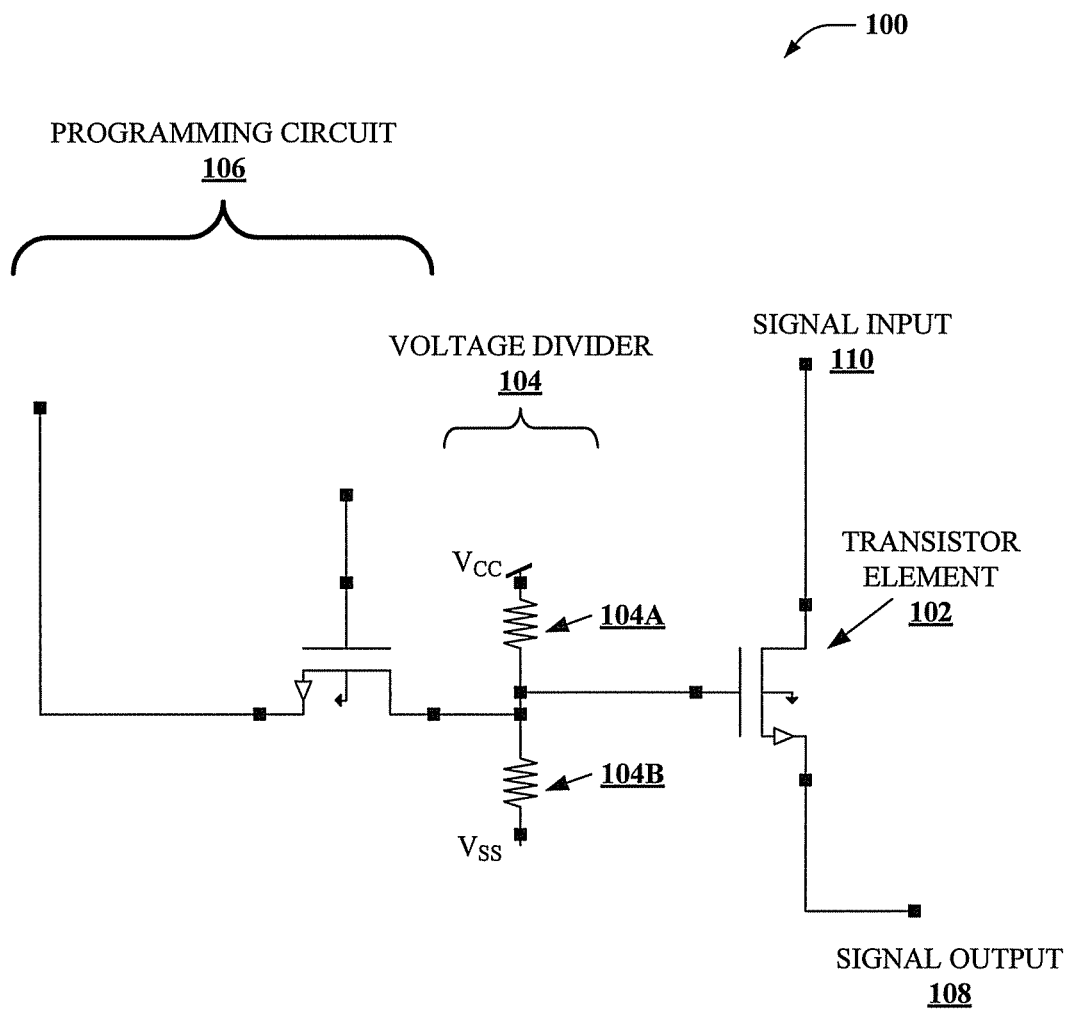
FIG. 1 depicts a schematic diagram of an example resistive random access memory (RRAM) cell according to one or more aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the claimed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the claimed subject matter.

Field programmable gate arrays (FPGAs) are employed in a wide range of electronic technology, serving as reconfigurable systems. In some applications, FPGAs can be integrated with microprocessors to serve as system-on-chip devices, which can be employed as a primary controller for various computer components, such as set top boxes and others. A wide range of uses for these devices exist, including telecommunications and networking, robotics, micro-electronics, small-scale industrial manufacturing, consumer electronics including handset computers, smart-phones and personal digital assistants, and the like, as well as other applications and technologies. Additionally, new applications are invented routinely as capabilities of FPGA and FPGA-based devices improve.

One basic FPGA architecture is the programmable switching block, which acts as a programmable signal routing matrix. A switching block comprises a set of parallel signal input lines intersected by a set of perpendicular signal output lines. At a junction of respective signal input lines and signal output lines is a configuration cell (also referred to herein as a configuration bit). Activation and deactivation of subsets of configuration cells at respective signal input/signal output junctions facilitate configuration of a programmable switching block. Particularly, a configuration cell at a given junction can be activated to electrically connect or route a signal input line to a signal output line at that junction, or can be deactivated to electrically isolate the signal input line and signal output line at that junction. The ability to activate or deactivate respective junctions is the basis for configurability of the programmable switching block. Thus, for instance, a set of electrical components connected to the signal inputs and signal outputs can be selectively inter-connected by activating particular junctions and deactivating other junctions. This selective inter-connection can enable some functionality, while disabling other functionality, in effect configuring the programmable switching block for the enabled functionality (which is a subset of all possible functionality thereof).

One of the more common FPGA configuration cells is the SRAM configuration cell. Probably the most typical SRAM configuration cell comprises six or more transistors, referred to as a 6 T SRAM cell. Four of the SRAM transistors form a pair of cross-coupled inverters, or latches. The SRAM cell has two stable states that denote respective states of a binary bit, 0 and 1. The remaining two transistors of the 6 T SRAM cell control access to a storage cell during read and write operations, and are referred to as access transistors.

In addition to the basic 6 T SRAM, other SRAM chips use eight transistors, ten transistors or more to store a single bit. Generally, the fewer transistors needed per cell the smaller the cell and the lower the cost of manufacture. The relatively large area of the 6 T SRAM cell (often greater than $125F^2$—where F denotes the minimum feature size, such as 65 nanometer, etc.) increases cost of manufacture while reducing transistor density, as compared with technologies having smaller component size. In addition, SRAM is volatile memory, requiring continuous power to maintain stored information, and is susceptible to memory loss from high frequency electromagnetic radiation (e.g., cosmic rays, high frequency ultraviolet, X-Ray, etc.). Moreover, a system designed with SRAM based FPGA typically requires external Flash memory to configure the SRAM bits during powerup sequence, slowing down the powerup sequence, and further adding to manufacture costs and increasing chip size.

Aspects of the subject disclosure provide alternatives to SRAM memory cells for FPGA technology. In one aspect, a programmable switching block is formed from resistive random access memory (RRAM), rather than SRAM memory. RRAM technology is based on dielectric material having programmable resistance (e.g., a resistance that can be altered between two or more states by application of an external force, such as a voltage). A simple RRAM memory cell can include a programmable resistance dielectric—having programmable high resistance and low resistance states—positioned between two otherwise isolated conductors. Thus, this simple RRAM memory cell can be conducting or non-conducting in response to a program voltage, mimicking the basic property of a pass gate transistor.

RRAM memory cells have several advantages over SRAM memory cells. First, RRAM technology is generally much smaller than SRAM, consuming silicon area on the order of $4F^2$ per adjacent RRAM device (e.g., a memory cell comprising two RRAM devices would therefore be approximately $8F^2$ if constructed in adjacent silicon space). Non-adjacent RRAM devices, e.g., stacked above or below each other, can consume as little as $4F^2$ for a set of multiple non-adjacent devices. This leads to much greater semiconductor component density, and lower manufacturing costs for a given number of transistors. Like SRAM, RRAM also has fast programming speed and low programming current, but unlike SRAM has high logic utilization. Further, RRAM is non-volatile memory; RRAM has the capacity to store data without continuous application of power. Therefore, RRAM based FPGAs utilizing non-volatile embedded RRAM as configuration bits can have a much faster power up cycle than the SRAM FPGAs, since external non-volatile memory is generally not required. In addition to the foregoing, RRAM cells can generally be built between metal interconnect layers, enabling RRAM FPGAs to be usable for two-dimension as well as three-dimension FPGA architectures.

One simple RRAM programmable switching block arrangement is called a RRAM cross-point cell. The RRAM cross-point cell comprises a dielectric material having discrete programmable resistances positioned at a signal junction of a programmable switching block (e.g., between a signal input line and a signal output line). The RRAM cross-point cell can operate as a configuration cell or configuration bit for the signal junction, as described herein. For instance, when activated the RRAM cross-point cell can configure the signal junction to pass a signal (e.g., when a programmable resistance of the RRAM cross-point cell is programmed to a low resistance state), and when deactivated the RRAM cross-point cell can configure the signal junction to block the signal (e.g., when the programmable resistance is erased, and in a high resistance state). Thus, the cross-point cell comprises a simple RRAM dielectric that acts as a switching device between the signal input and signal output. Generally, the cross-point cell is programmed or erased by application of a suitable program or erase voltage to the signal lines.

Although the RRAM cross-point cell is a simple device, it has some drawbacks relative to metal oxide semiconductor (MOS) or complementary metal oxide semiconductor (CMOS) configuration cells. First, a resistance value of a typical RRAM when on or programmed (also referred to as the on resistance, or $R_{on}$) is usually higher than a MOS transistor's resistance, in a similar programmed state. This means that a signal will propagate more slowly through a signal intersection activated with an RRAM configuration cell based on the simple cross-point cell, as compared to a MOS or CMOS-based configuration cell. In addition, typical RRAM cross-point cells often have lower erase resistance (also referred to as off resistance, or $R_{off}$) than typical MOS or CMOS transistors. This lower $R_{off}$ can result in a sizable parasitic signal through the signal intersection when the RRAM cross-point cell is erased. A MOS Roff/Ron ratio (also referred to herein as a cutoff ratio) is usually more than $10^6$, while typical RRAM can reliably deliver cutoff ratios of up to $10^3$, but are less reliable above that quantity. Thus, FPGA configuration cells implemented only with the RRAM cross-point cell as a switching device may be unsuitable for applications requiring higher cutoff ratios, unless the cutoff ratio is improved to reasonably match typical cutoff ratios of MOS or CMOS transistors. Therefore, FPGA manufacturers are limited for many applications to a MOS or CMOS based switching transistor (pass gate transistor), connected to an SRAM cell to activate and deactivate the switching transistor.

Additional aspects of the subject disclosure provide an RRAM-based configuration cell having a significantly higher activation/deactivation resistance ratio (cutoff ratio), in conjunction with a die size much smaller than SRAM configuration cells. In some aspects, an RRAM configuration cell is provided having a plurality of resistive elements and one or more transistor elements. In one such aspect, the resistive elements can form a voltage divider having a common node that drives a gate of a pass gate transistor. Moreover, the pass gate transistor can include a transistor having a cutoff ratio on the order of $10^6$ or greater. In at least one aspect, the pass gate transistor can comprise a CMOS transistor.

According to further aspects, the RRAM-based configuration cell comprises programming circuitry that is independent of signal input and signal output lines of an associated FPGA programmable switching block. The independent programming circuitry can improve input signal to output signal propagation performance since the programming circuits are not generating additional load capacitance and leakage on the input signal and output signal lines. In a particular aspect, the programming circuitry can include a transistor element that facilitates complementary programming of resistive elements of a voltage divider. The complementary programming can in turn drive alternate states of a pass gate transistor, activating or deactivating the pass gate transistor.

The RRAM-based configuration cell can yield significant advantages over other programmable switching blocks implemented with simple RRAM cross-point cells. For instance, because input signal lines and output signal lines of an FPGA are connected or isolated by a pass gate transistor having a high cutoff ratio, rather than an RRAM dielectric with $10^3$ cutoff ratio, high speed applications can be served with good noise immunity. Moreover, better signal integrity and disturb immunity can be achieved because the signal path is not routed through the RRAM cell. Because programming circuitry is independent of the signal lines, related signal degradation can be mitigated or avoided.

Referring now to the drawings, FIG. 1 illustrates a schematic diagram of an example RRAM configuration cell 100 according to various aspects of the subject disclosure. RRAM configuration cell 100 can be employed as a component of various electronic systems and architectures, including a FPGA device. In at least one aspect of the subject disclosure, RRAM configuration cell 100 can be employed for a programmable switching block, for instance, involved with activating or deactivating signal input and output junctions thereof. Further, RRAM configuration cell 100 can be relatively small. For instance, transistor element 102 can be about $10-12F^2$ (e.g., about $11F^2$) and programming circuit 106 can be about an additional $12F^2$ in size. While voltage divider 104 can be approximately $8F^2$ in size in some disclosed aspects, in at least one aspect of the subject disclosure voltage divider 104 can be constructed over (or under) programming circuit 106 or over (or under) transistor element 102, so as to not add additional area to programming circuit 106. Thus, RRAM configuration cell 100 including programming circuit 106, voltage divider 104 and transistor element 102 can be about $24F^2$ in size. In a particular aspect, transistor element 102 and voltage divider 104 can consume about $11F^2$ of silicon space (e.g., where voltage divider 104 is fabricated above or below transistor element 102 in the silicon space), and in an alternative aspect programming circuit 106 and voltage divider 104 can consume about $12F^2$ of silicon space in a similar manner. When compared to a similar SRAM memory cell having 6 transistors to control the gate of transistor element 102, in addition to a programming transistor(s), with size of $120F^2$ or more, RRAM configuration cell 100 is relatively small. (Note that F is defined as a minimum feature size, e.g., 130 nanometer, 90 nanometer, 65 nanometer, 45 nanometer, 32 nanometer, and so on, of the fabrication technology employed to generate the cell).

RRAM configuration cell 100 can comprise a transistor element 102. Transistor element 102 can comprise a gate-driven transistor having relatively high cutoff ratio. Examples of transistor element 102 can include an NMOS transistor, a PMOS transistor, or a CMOS transistor (e.g., an NMOS+PMOS transistor), or other suitable three-terminal transistor. In at least one aspect of the subject disclosure, transistor element 102 can be selected for suitable electrical characteristics, including switching speed, power consumption, cutoff ratio (e.g., about $10^6$, about $10^7$, or greater), or the like, or a suitable combination thereof. The electrical characteristics can be matched to an anticipated application or group of applications in which RRAM configuration cell 100 is intended for use.

Further, transistor element 102 has at least a gate and a channel region. The gate of transistor element 102 can be driven by a common node of a voltage divider 104. Voltage divider 104 therefore controls activation/deactivation states of transistor element 102. In at least one aspect of the subject disclosure, voltage divider 104 can be a programmable voltage divider. Particularly, voltage divider 104 can comprise two programmable resistive elements (e.g., first programmable resistive element 104A, second programmable resistive element 104B) having respective programmable resistances. For instance, the resistive elements 104A, 104B can have at least a first programmable resistance and a second programmable resistance, where the second programmable resistance is a different resistance value from the first programmable resistance. In a first aspect of the subject disclosure, the first and second programmable resistive elements 104A, 104B can be programmed or erased to have the first and second programmable resistances, respectively (e.g., low resistance and high resistance). In a second aspect, the first and second programmable resistive elements 104A, 104B can be erased or programmed to have the second and first programmable resistances, respectively (e.g., high resistance and low resistance). In a third aspect, the first and second programmable resistive elements 104A, 104B can be erased to the second programmable resistance (e.g., both high resistance). In a fourth aspect, the first and second programmable resistive elements 104A, 104B can be programmed to have the first programmed resistance (e.g., both low resistance).

One operational example for voltage divider 104 is as follows. The first programmable resistive element 104A can be programmed to a low resistance and the second programmable resistive element 104B can be erased to a high resistance. This state can be utilized, for instance, to activate or to turn on transistor element 102. In another state, the first programmable resistive element 104A can be erased to a high resistance and the second programmable resistive element 104B can be programmed to a low resistance. This state can be utilized, for instance, to turn off transistor element 102. In yet another state, both the first programmable resistive element 104A and the second programmable resistive element 104B can be erased to the high resistance state. This third state can be utilized, for instance, as an intermediate state while changing states from programming to erase. In at least one aspect, the third state can also serve as a suitable initial factory setting.

The programmable resistance of voltage divider 104 determines whether a positive source voltage (not depicted) is applied to the gate of transistor element 102 (activating transistor element 102), or whether ground or its equivalent is applied to the gate of transistor element 102 (deactivating transistor element 102). Accordingly, the program state of voltage divider 104 determines activation/deactivation state of transistor element 102.

A programming circuit 106 is depicted for RRAM configuration cell 100. As depicted, programming circuit 106 can be independent of signal lines of associated communication circuitry (e.g., signal input and signal output lines of a programmable switching block). Programming circuit 106 can include at least one program transistor that, in conjunction with pull up and pull down voltage sources (not depicted), can program the resistive elements of voltage divider 104. In at least one aspect, programming circuit 106 can be operated to program the resistive elements in a complementary fashion, as is described in more detail herein (e.g., see FIGS. 2, 3A, 3B and 6, infra).

As depicted, in FIG. 1, transistor element 102 can be electrically connected to a signal output line 108 and a signal input line 110. Thus, activating transistor element 102 can enable conductivity between signal output 108 and signal input 110. Likewise, deactivating transistor element 102 can electrically isolate signal output 108 from signal input 110. In this manner, transistor element 102 acts as a pass gate transistor with respect to the electrical junction of signal input 110 and signal output 108. In similar arrangements, RRAM configuration cell 100 can be utilized for configuring or re-configuring a programmable switching block. Particularly, by forming respective RRAM configuration cells 100 at respective input/output junctions of the switching block, and controlling the activation/deactivation of these RRAM configuration cells 100, configuration of the respective input/output junctions can be accomplished, as is described in more detail herein (e.g., see FIG. 5, infra).

Figure 2:
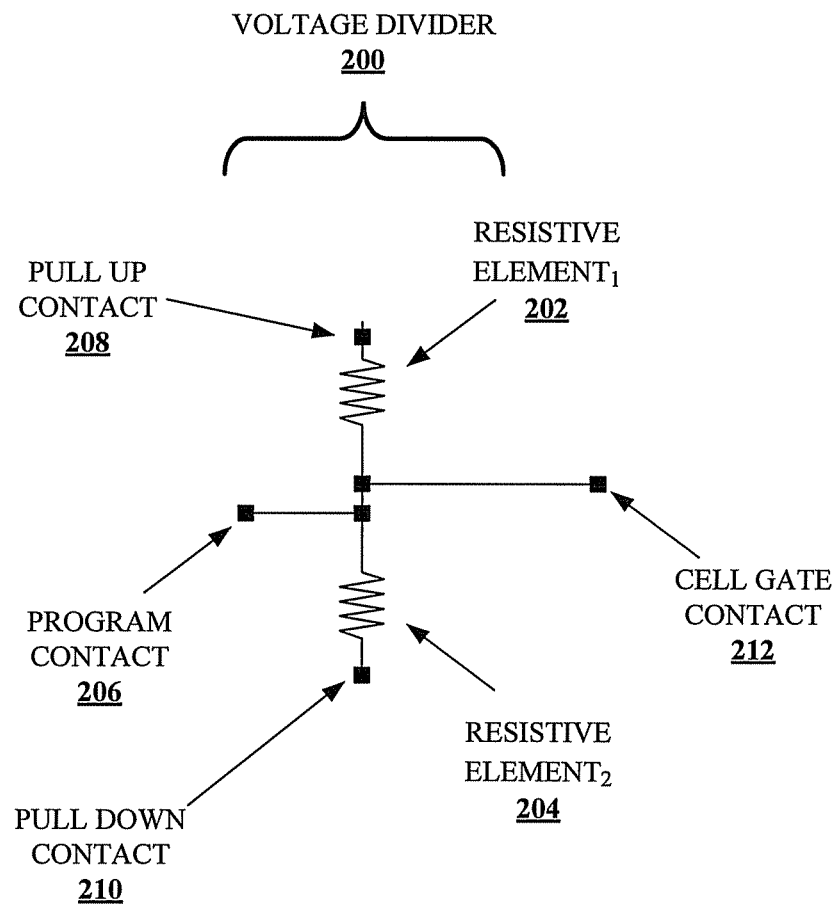
FIG. 2 illustrates a sample schematic diagram of a voltage divider utilized for the RRAM cell of FIG. 1 according to some aspects.

FIG. 2 depicts a schematic diagram of an example voltage divider circuit 200 according to further aspects of the subject disclosure. In at least one aspect, voltage divider circuit 200 can be substantially similar to voltage divider 104 of FIG. 1, supra. Particularly, voltage divider circuit 200 can be configured to drive a transistor element of an RRAM configuration cell, as described herein.

Voltage divider circuit 200 can comprise a first resistive element, resistive element$_1$ 202 and a second resistive element, resistive element$_2$ 204. As depicted, resistive element$_1$ 202 and resistive element$_2$ 204 are arranged electrically in series. Additionally, resistive elements 202 and 204 can have programmable resistance values.

In some aspects of the subject disclosure, resistive elements 202 and 204 can be formed of a suitable dielectric material that can be programmed to have two or more discrete resistance values. In one particular aspect, resistive element$_1$ 202 and resistive element$_2$ 204 are comprised of the same dielectric material and have substantially the same two or more discrete resistance values. In another aspect, resistive element$_1$ 202 and resistive element$_2$ 204 can be comprised of different dielectric materials, or can have different discrete resistance values, or a combination thereof.

According to at least one aspect of the subject disclosure, resistive element$_1$ 202 can serve as a pull up resistor for a RRAM configuration cell, whereas resistive element$_2$ 204 can serve as a pull down resistor for the RRAM configuration cell. Further, the pull up resistor has a first programmable resistance that can be programmed at least to a first resistance value or a second resistance value, where the first resistance value is smaller than the second resistance value. Moreover, the pull down resistor has a second programmable resistance. In at least one aspect of the subject disclosure, the second programmable resistance can be set at least to a third resistance value or a fourth resistance value. In a particular aspect, the third resistance value of the pull down resistor can be substantially equal to the first or second resistance value (of the pull up resistor), or the fourth resistance value of the pull down resistor can be substantially equal to the first or second resistance values, or a suitable combination thereof.

In other aspects, a ratio of respective resistance values of the pull up resistor and pull down resistor can determine a cutoff ratio of the respective resistors. A general convention for the cutoff ratio is to divide a higher of the programmable resistances by a lower of the programmable resistances (e.g., 1 giga-ohms/100 kilo-ohms). For instance, a cutoff ratio of the pull up resistor can be equal to the first resistance value divided by the second resistance value, whereas a cutoff ratio of the pull down resistor can be equal to the third resistance value divided by the fourth resistance value. In a particular aspect, resistive element$_1$ 202 or resistive element$_2$ 204 can have a cutoff ratio at least of $10^3$. In one aspect, one or more of the cutoff ratios can be $10^4$ or more, and in yet another aspect, one or more of the cutoff ratios can be $10^5$ or more.

In addition to the foregoing, the pull up resistor and pull down resistor can be programmed in a complementary fashion, such that when the pull up resistor is programmed to the first resistance value ($R_{PU}$ ON—conducting state for $R_{PU}$), the pull down resistor is erased to the second resistance value ($R_{PD}$ off—non-conducting state for $R_{PD}$), and vice versa. Resistive elements 202 and 204 can be set to a particular resistance value by application of a suitable voltage across the respective resistance elements 202 and 204. For instance, resistive elements 202 and 204 can be set to $R_{PU}$ ON (low resistance, conducting state) or $R_{PD}$ ON, respectively, upon application of the voltage to the pull up resistor or the pull down resistor, respectively. If an erase voltage is applied to the pull up resistor or pull down resistor, these resistors will have the $R_{PU}$ OFF (e.g., the second resistance value) or $R_{PD}$ OFF (e.g., the fourth resistance value), respectively. Said differently, programming either resistor to the low resistance, conducting state can be accomplished by applying a program voltage to the resistor, whereas the respective resistors are in a high resistance, non-conductive state when an erase voltage is applied thereto (whether for unipolar or bipolar RRAM).

Voltage can be applied to the pull up resistor and pull down resistor via three voltage contacts, a program contact 206, pull up contact 208 and pull down contact 210. Moreover, the three voltage contacts can be operated to program the resistive elements 202 and 204 in a complementary fashion. Particularly, by applying substantially the same voltage at the program contact 206 and one other of the two contacts (208, 210), a substantially zero voltage drop can be applied across one of the resistive elements. Further, by applying a second voltage having a difference in magnitude of at least the program voltage, the remaining of the two resistive elements observes the program voltage. As a more specific example, applying the program voltage to both program contact 206 and pull up contact 208 results in substantially no voltage drop across resistive element$_1$ 202, rendering the pull up resistor un-programmed. Applying zero volts (or ground) at the pull down contact 210 then causes a voltage drop substantially equivalent to the program voltage across resistive element$_2$ 204, thus programming the pull down resistor. In contrast, application of high voltage at pull up contact 208, zero voltage at pull down resistor 210 and zero voltage at program contact 206 results in programming of the pull up resistor (which observes program voltage at pull up contact 208 and zero volts at program contact 206) and non-programming of the pull down resistor (which observes zero volts at both pull down contact 210 and program contact 206).

In the foregoing example, it can be understood that complementary programming of an initially erased pull up resistor and initially erased pull down resistor can be accomplished by tying pull up contact 208 to the program voltage (e.g., three volts), and tying pull down contact 210 to zero volts, and simply applying program contact 206 to zero volts or to the program voltage. Zero volts on contact 206 will program the pull up resistor (resistive element$_1$ 202), and program voltage on contact 206 will program the pull down resistor (resistive element$_2$ 204) in this configuration. This is only one example implementation, however, and is not intended to limit the scope of the subject disclosure. Regardless of how complementary programming is implemented, voltage divider 200 results in distinct voltages at cell gate contact 212, depending on respective states of the pull up resistor and pull down resistor. These distinct voltages can configure a pass gate transistor to be active or inactive. For instance, where pull up contact 208 is set to the program voltage and pull down contact 210 is set to zero volts, activating the pull up resistor and deactivating the pull down resistor results in charging up cell gate contact 212; in effect passing the positive voltage source applied at node 208 to cell gate contact 212. In RRAM configuration cell 100 of FIG. 1, for instance, this could activate transistor element 102 having a gate electrically connected to cell gate contact 212. In contrast, erasing the pull up resistor and programming the pull down resistor causes charging down of cell gate contact 212 and thereby deactivating any transistor gate connected to cell gate contact 212.

Figure 3A:
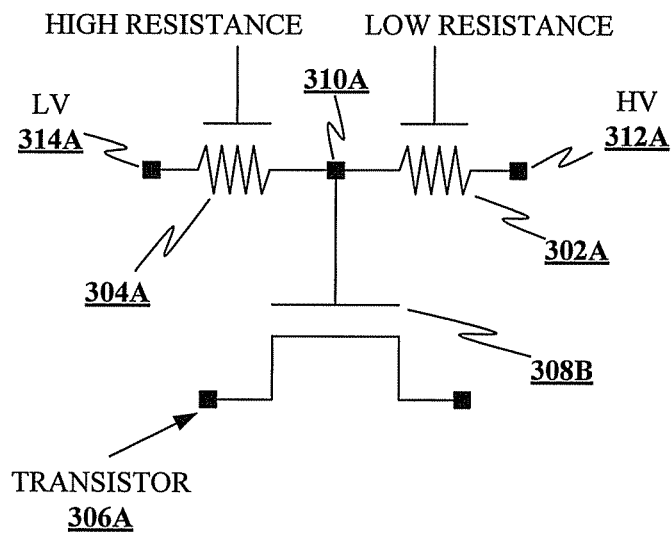
FIG. 3 depicts a schematic diagram of an example voltage divider and transistor element of the RRAM cell of FIG. 1 according to further aspects.
Figure 3B:
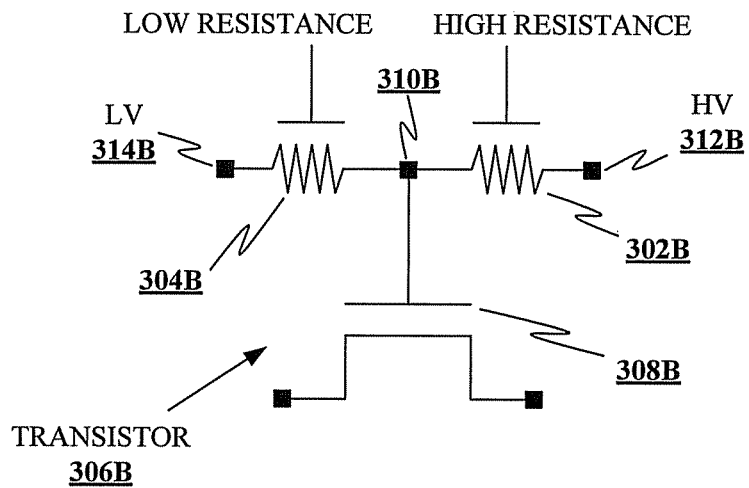

FIGS. 3A and 3B illustrate alternate program states of a two-resistor, single transistor memory cell according to further aspects of the subject disclosure. Particularly, FIG. 3A illustrates a closed transistor, or conducting state of the memory cell. In contrast, FIG. 3B depicts an open transistor, or non-conducting state of the memory cell. Referring first to FIG. 3A, circuit 300A comprises a first resistive element 302A and a second resistive element 304A arranged electrically in serial. Resistive elements 302A and 304A have multiple discrete programmable resistances. For instance, resistive elements 302A and 304A can be formed of one or more RRAM dielectrics that can be programmed to a first discrete programmable resistance (e.g., a program resistance) upon application of a suitable voltage thereto (e.g., a program voltage), and to a second discrete programmable resistance (e.g., an erase resistance) upon application of another suitable voltage (e.g., an erase voltage). It should be appreciated that different RRAM technologies exist, having different discrete programmable resistances, and different associated program/erase voltage. For instance, a unipolar RRAM, once initially programmed, can be later programmed in response to a first positive voltage (e.g., three volts) and erased in response to a second positive voltage (e.g., between four and five volts). Bipolar RRAM, on the other hand, becomes programmed in response to a positive voltage and erased in response to a negative voltage. Where no specific RRAM technology or program/erase voltage is specified for the various aspects and embodiments herein, it is intended that such aspects and embodiments incorporate any suitable RRAM technology and be operated by program/erase voltages appropriate to that RRAM technology, as would be known by one of ordinary skill in the art or made known by way of the context provided herein.

In addition to the foregoing, circuit 300A has a transistor 306A comprising a gate 308B and a channel region. Transistor 306A can be a suitable three-terminal transistor device (e.g., an NMOS, a PMOS or a CMOS transistor). As depicted, gate 308A can be driven by a common node 310A of resistive elements 302A and 304A. Additionally, first resistive element 302A is connected to voltage contact 312A, having a voltage value suitable for programming resistive element 302A to a low resistance state, also referred to as activating resistive element 302A. Resistive element 304A, on the other hand, is connected to a voltage contact 314A having low voltage (e.g., ground, a negative voltage, or other suitable voltage lower than the voltage applied at voltage contact 312A), as indicated.

As depicted, resistive element 302A is programmed, having low resistance. Being complementary, resistive element 304A is erased, having high resistance. Accordingly, a program voltage generated at voltage contact 312A can drive common node 310A, thereby activating transistor 306A. Thus, transistor 306A is in the conducting state.

FIG. 3B illustrates a circuit 300B in an inactive state (where transistor 306B is turned off). Circuit 300B has the same general architecture as circuit 300A, including a first resistive element 302B and a second resistive element 304B arranged electrically in serial. A transistor 306B has a gate 308B connected to a common node 310B of first resistive element 302B and second resistive element 304B. Furthermore, first resistive element 302B is connected to voltage contact 312B having a program voltage applied thereto (e.g., a high positive voltage), and second resistive element 304B is connected to a voltage contact 314B having low voltage (e.g., ground).

Different from circuit 300A, first resistive element 302B has high resistance (e.g., erased) whereas second resistive element 304B has low resistance (e.g., programmed). This can be accomplished, for instance, by applying high voltage 312B at common node 310B. Thus, first resistive element 302B experiences substantially no voltage drop, whereas second resistive element 304B experiences a voltage drop substantially equal to the voltage applied at voltage contact 312B (e.g., the program voltage). Accordingly, current can flow to voltage contact 314B, thus programming the pull down resistor to a low resistance state. During read operation, $V_{CC}$ is applied to voltage contact 312B, and ground is applied to voltage contact 314B, draining charge from gate 308B. This in turn deactivates transistor 306B, rendering transistor 306B in the non-conducting state. As described, circuit 300A and circuit 300B can depict alternate states of RRAM configuration cell 100, in at least one aspect of the subject disclosure.

Figure 4:
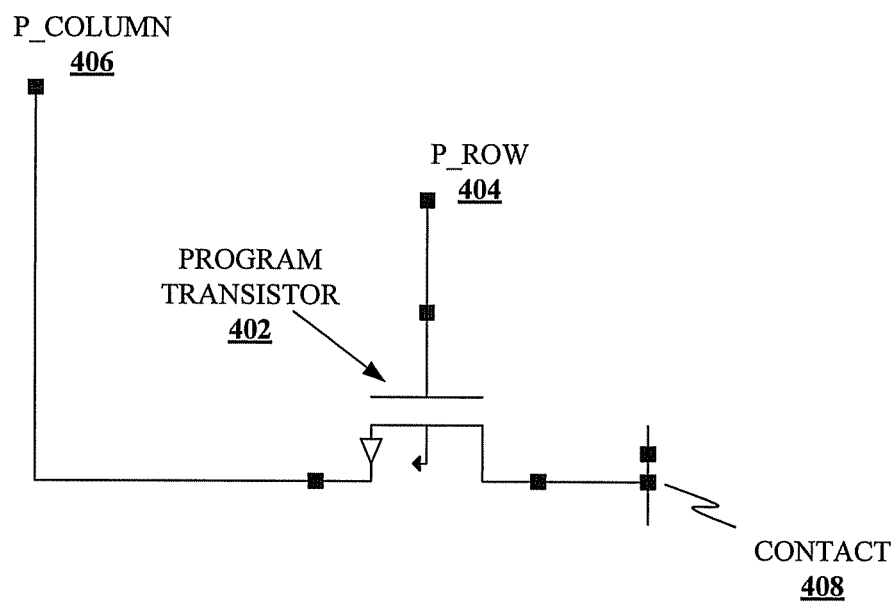
FIG. 4 illustrates a schematic diagram of a sample programming circuit of the RRAM cell of FIG. 1 in an additional aspect.

FIG. 4 illustrates a schematic diagram of a sample programming circuit 400 according to still other aspects of the subject disclosure. Programming circuit 400 can be utilized during programming and erasing of an RRAM configuration cell, but is generally not active during standby or read operations. In at least one aspect, programming circuit 400 can be substantially similar to programming circuit 106 of FIG. 1, supra. However, neither programming circuit 106 nor programming circuit 400 is limited to this aspect.

As depicted, programming circuit 400 can comprise a program transistor 402. Program transistor 402 can be any suitable switching transistor or pass gate transistor device. In one aspect of the subject disclosure, program transistor 402 can comprise a three-terminal transistor device. Additionally, programming circuit 400 can comprise a row programming contact 404 connected to a gate of program transistor 402. By applying a suitable positive voltage to row programming contact 404, program transistor 402 is activated. By applying a lesser voltage, or ground, to row programming contact 404, program transistor 402 is deactivated.

Further to the above, programming circuit 400 can comprise a column programming contact 406. Column programming contact 406 is connected to a channel region of program transistor 402. This arrangement causes a voltage applied at column programming contact 406 to be propagated to program contact 408 when program transistor 402 is activated, as described above, and causes column programming contact 406 to be isolated from program contact 408 when program transistor 402 is deactivated (e.g., during a read or standby operation). Where program contact 408 is connected to one or more programmable resistances, programming circuit 400 can facilitate programming (or erasing) the programmable resistance(s). This can be accomplished in part by first activating program transistor 402 and then applying a suitable program voltage at column programming contact 406. This program voltage is propagated to program contact 408 by programming circuit 400, applying at least one voltage to one or more of the programmable resistances.

According to a particular aspect of the subject disclosure, program contact 408 can be substantially equivalent to program contact 206 of FIG. 2, or substantially equivalent to common node 310A or 310B of FIG. 3A or 3B, respectively. In this case, one example implementation of programming circuit 400 can be to program or erase respective programmable resistor elements of a voltage divider to respective program or erase states. Thus, a voltage propagated to program contact 408 from column programming contact 406 is also observed at the common node of the voltage divider. When appropriate voltages are also applied to respective dedicated nodes associated with the voltage divider, the voltage divider can be programmed to different states by programming circuit 400, as described in FIGS. 3A and 3B, supra.

As a particular example, consider the case where programming circuit 400 is connected to common node 310A/310B of FIGS. 3A and 3B. To activate programming circuit 400, a program voltage is applied to row programming contact 404, which activates program transistor 402. The activated program transistor 402 passes a voltage applied at column programming contact 406 to program contact 408. To program the pull down resistor (depicted at FIG. 3B), a program voltage (e.g., high positive voltage) is applied at column programming contact 406, and low voltage (e.g., ground, zero volts, etc.) is applied at contact 314B. To program the pull up resistor (FIG. 3A), the low voltage is applied to column programming contact 406 and the program voltage is applied to high voltage (contact) 312A. To erase the pull up resistor once it is programmed (e.g., resistive element 302A), the program voltage is applied to column programming contact 406 while ground is applied to voltage contact 312A. Likewise, to erase the pull down resistor once it is programmed (e.g., resistive element 304B), the program voltage is applied to voltage contact 314B and ground is applied to column programming contact 406.

The programming and erasing of pull up and pull down resistors described above can in turn drive activation/deactivation of a pass transistor having its gate connected to program contact 408 (e.g., transistor 306A transistor 306B, transistor element 102, etc.). Specifically, programming circuit 400 can be utilized in part to program or erase pull up and pull down resistors, which in turn control activation/deactivation of the pass gate transistor. This controlled activation/deactivation of the pass gate transistor provides one mechanism for configuring the programmable switching block junction.

Figure 5:
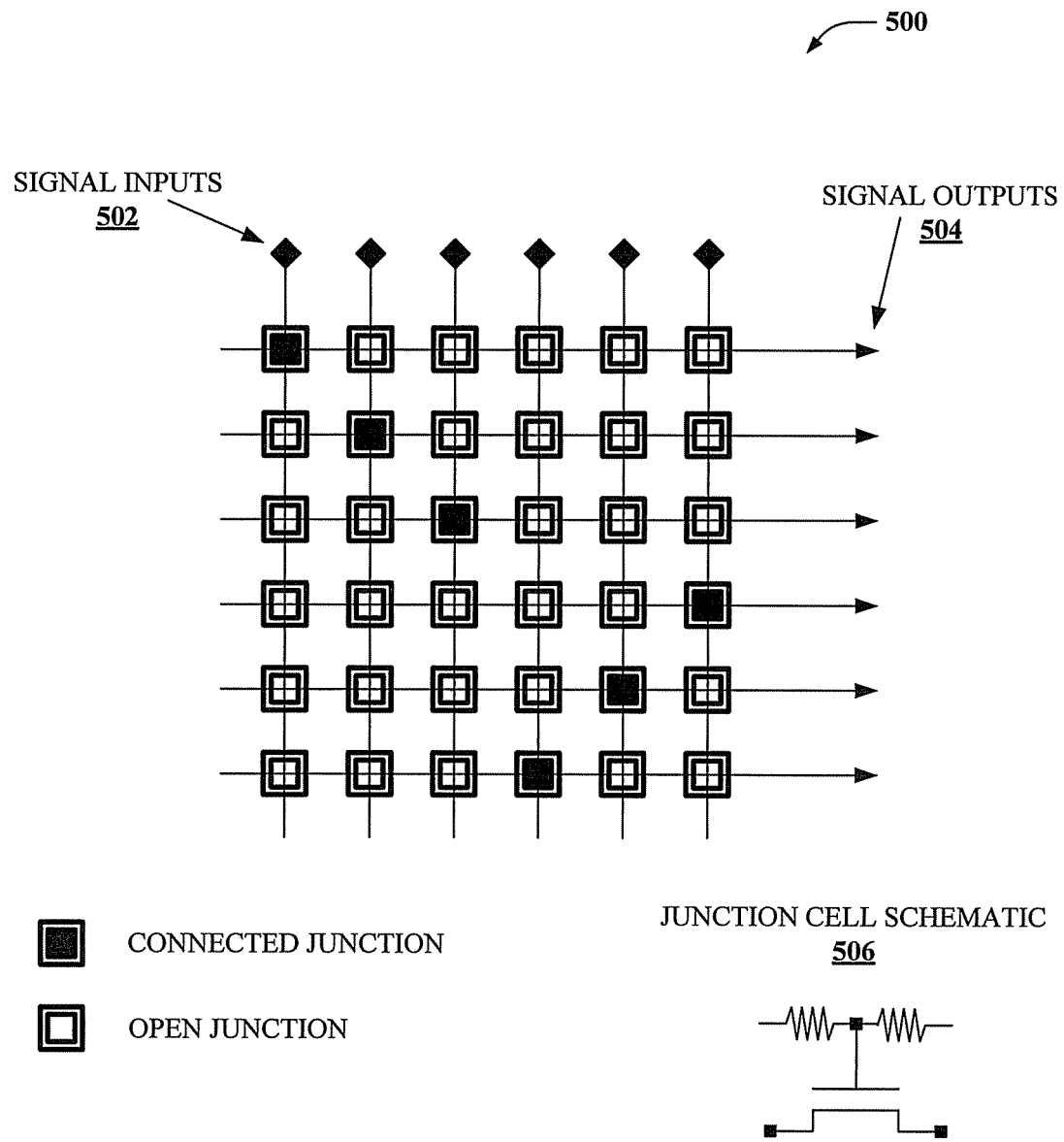
FIG. 5 depicts a block diagram of an example switching block interconnect utilizing RRAM cells according to yet other aspects.

FIG. 5 illustrates a block diagram of an example programmable switching block 500 according to further aspects of the subject disclosure. According to particular aspects, programmable switching block 500 can be programmed via RRAM-based memory cells. In at least one such aspect, the RRAM-based memory cells can be described substantially according to memory cell 100. In another aspect, the RRAM-based memory cells can be described by a combination of voltage divider 200, programming circuit 400, and pass gate transistor 306A or 306B.

Programmable switching block 500 can comprise a set of signal inputs 502 intersecting a set of signal outputs 504 that are parallel to set of signal inputs 502. Moreover, a RRAM junction cell is formed at respective junctions of signal input lines 502 and signal output lines 504. In at least one aspect, the RRAM junction cells can correspond with the junction cell schematic 506.

The RRAM junction cell is configured, in an activated or programmed state, to electrically connect a signal input line and a signal output line at a particular junction, and in a deactivated or erased state, to electrically isolate the signal input line and the signal output line. A connected junction is a programmed junction, depicted by a black square at the respective junction. An isolated junction is an open junction, depicted by a white square at the respective junction.

It should be appreciated that respective junctions of programmable switching block 500 can be reprogrammed (e.g., by changing activation/deactivation states of configuration cells positioned at the respective junctions). Thus, although a particular program state is depicted by the connected junctions and open junctions of FIG. 5, the depicted example is only one possible program state for programmable switching block 500. Further, it should be understood that programmable switching block can be reprogrammed in the field, for FPGA applications.

In addition to the foregoing, in at least some aspects of the subject disclosure, programmable switching block 500 can have bidirectional signal inputs and signal outputs. Said differently, one (or more) of signal outputs 504 can initiate a signal, which can be received at a corresponding one (or more) of signal inputs 502. As described herein, whether this signal is received or not received at the signal input is determined from a configuration state of an associated RRAM configuration cell. If the associated RRAM configuration cell is configured as a closed circuit, the signal can be received at the corresponding signal input; otherwise, the signal is not received. Therefore, although programmable switching block 500 identifies respective signal inputs 502 and signal inputs 504, it should be appreciated that in the above-described aspects signal inputs 502 and signal outputs 504 can be renamed signal contacts 505 (not depicted) having a first end 505A and second end 505B, that can be employed for either transmitting or receiving a signal, or both, under suitable conditions (e.g., signals of different frequency, phase, or other suitable distinguishing characteristic could be transmitted concurrently at first end 505A and second end 505B, and received at the corresponding other end 505B and 505A, respectively).

Figure 6:
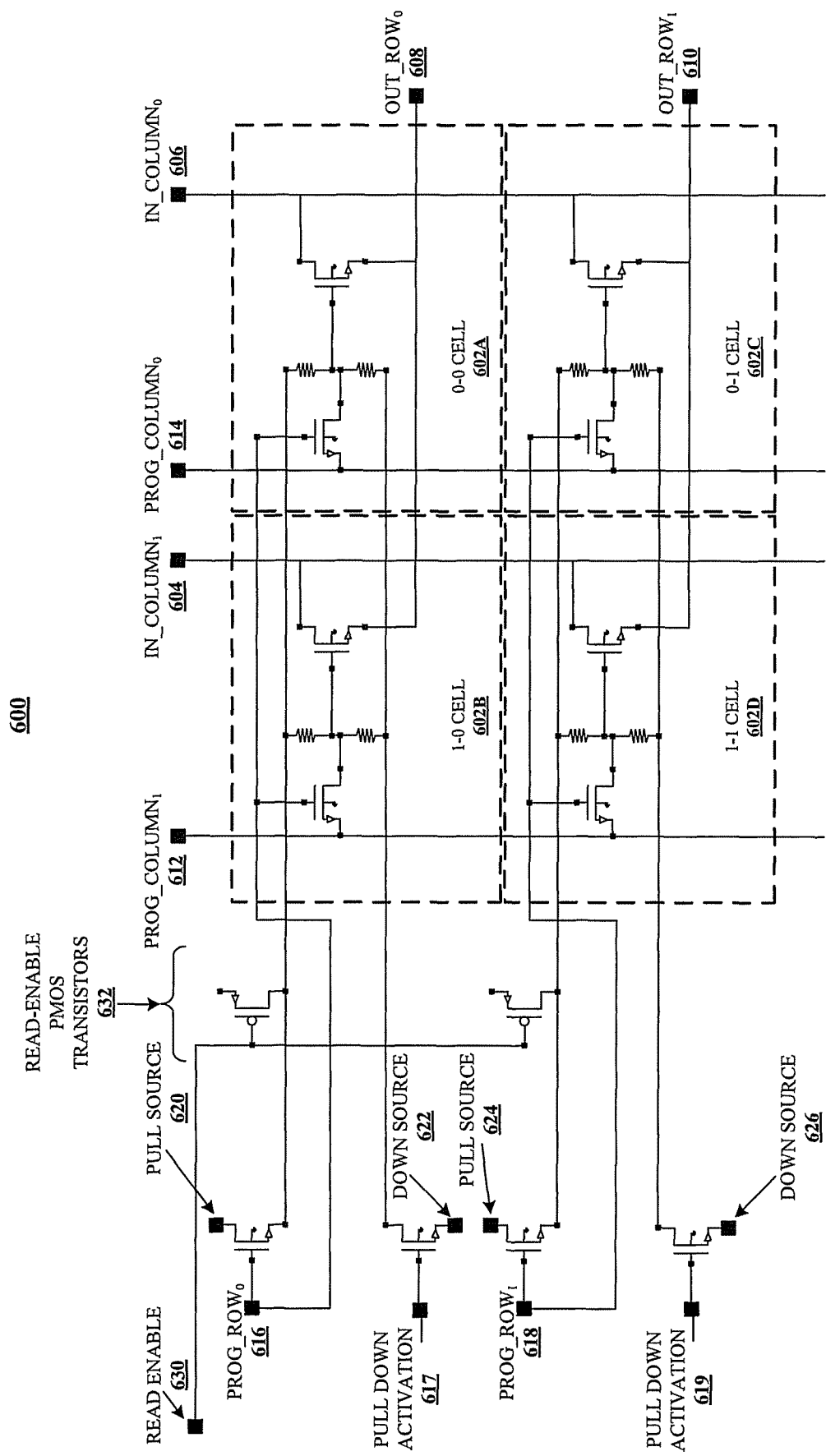
FIG. 6 illustrates a schematic diagram of an example two-by-two interconnect utilizing RRAM cells according to a particular aspect.

FIG. 6 illustrates a schematic diagram of an example subset of a programmable switching block 600 according to aspects of the subject disclosure. Particularly, programmable switch block 600 comprises four different memory cells at four respective switching block junctions, including cell 0-0 602A, 1-0 602B, 0-1 602C and 1-1 602D (referred to collectively as cells 602A-602D). The naming convention for cells 602A-602D indicate a column number as a first identifier followed by a row number as a second identifier. Thus, cell 1-0 refers to a cell in column 1 and row 0, and cell 0-1 refers to a cell in column 0 and row 1.

Respective cells 602A-602D comprise respective RRAM-based configuration cells. In at least one aspect of the subject disclosure, the RRAM-based configuration cells can be substantially similar to RRAM configuration cell 100. A pass gate transistor of the RRAM-based configuration cells is interposed between respective junctions of input signal columns and output signal rows. This arrangement enables respective pass gate transistors to activate or deactivate the respective junctions. Thus, a junction of input_column$_1$ 604 and output_row$_0$ 608 is controlled (e.g., activated or deactivated) by the pass gate transistor of 1-0 cell 602B. Likewise, a junction of input_column$_0$ 606 and output_row$_0$ 608 is controlled by the pass gate transistor of 0-0 cell 602A, a junction of input_column$_1$ 604 and output_row$_1$ 610 is controlled by the pass gate transistor of 1-1 cell 602D, and a junction of input_column$_0$ and output_row$_1$ 610 is controlled by 0-1 cell 602C.

Respective program transistors associated with row$_0$ and row$_1$ are activated and deactivated by voltages applied at programming_row$_0$ 616, and by programming_row$_1$ 618, respectively. A voltage applied at programming_column$_1$ 612 is passed to a common node of the voltage divider of 1-0 cell 602B when row$_0$ program transistors are activated by programming_row$_0$ 616. Likewise, a voltage applied at programming_column$_0$ 614 is passed to a common node of the voltage divider of 0-0 cell 602A when row$_0$ program transistors are activated. Thus, programming/erasing row$_0$ voltage dividers is accomplished by applying an activation voltage (e.g., three volts) at programming_row$_0$ 616, and applying suitable program or erase voltages at programming_column$_1$ 612 (for 1-0 cell 602B) and at programming_column$_0$ 614 (for 0-0 cell 602A). Moreover, a pull up voltage source 620 applies a voltage to respective pull up resistors of voltage dividers in row 0, whereas a pull up voltage source 624 applies a voltage to respective pull up resistors of voltage dividers in row 1. Pull down activation contact 617 can activate or deactivate a row$_0$ pull down transistor, enabling a voltage applied at a pull down source 622 to be applied to pull down resistors of voltage dividers in row 0. Likewise, pull down activation contact 619 can activate or deactivate a row$_1$ pull down transistor, enabling a voltage applied at pull down source 626 to be applied to pull down resistors of voltage dividers in row 1.

In addition to the foregoing, a read enable circuit is provided that facilitates application of a $V_{CC}$ voltage to the pull up resistors of cells 602A-602D. The read enable circuit comprises a read enable voltage source 630. Additionally, the read enable circuit comprises respective PMOS transistors 632. A drain of the respective PMOS transistors 632 is connected to respective pull up transistors of voltage dividers in row 0, as depicted.

Various operating examples of switching block 600 are depicted at FIGS. 7-11, infra. Unless otherwise indicated, element/component numbering of switching block 600 applies as described above to each of FIGS. 7-11. Where a single component has one reference number in FIG. 6 and another reference number in respective ones of FIGS. 7-11, the FIG. 6 reference number indicates a name or identifier of a circuit component, whereas reference numbers of FIGS. 7-11 indicate respective voltages at those circuit components. Thus, the single component should be construed to have both the characteristics of the respective FIGS. 7-11 (e.g., respective voltages), as well as characteristics identified above for switching block 600 (e.g., circuit component name or identifier). As an example, pull down voltage source 622 has the label 0V 706 in FIG. 7. This indicates that the particular component (voltage source) is both a pull down voltage source and has 0 volts applied to that voltage source for the row$_0$ programming operation of FIG. 7. However, in FIG. 9, pull down voltage source 622 has high voltage HV 904 applied thereto, and thus the row$_0$ erase operation of FIG. 9 should not be construed to have zero volts applied to pull down voltage source 622.

Figure 7:
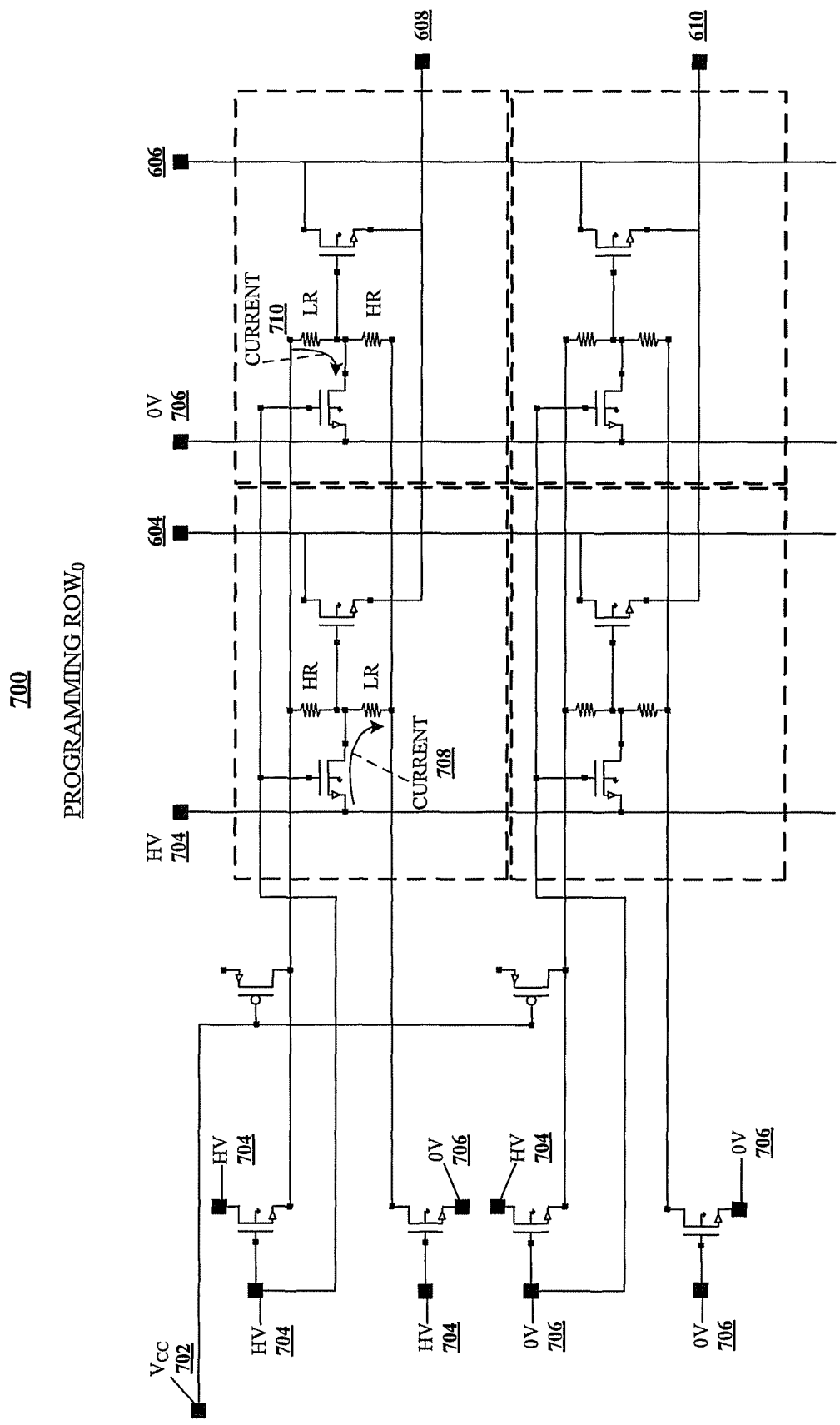
FIG. 7 depicts a schematic diagram of an example programming operation for the two-by-two interconnect of FIG. 6 according to further aspects.

FIG. 7 illustrates an example schematic diagram 700 of a row programming operation for the programmable switching block 600. Particularly, the row programming operation involves programming for row$_0$. As depicted, a common-collector voltage ($V_{CC}$) 702 can be applied to read enable contact 630 (which deactivates read-enable PMOS). Further, a high voltage HV 704 (e.g., a program voltage) can be applied where indicated, for instance at program_column$_1$, pull up voltage sources, and program_row$_0$. Likewise, zero voltage 0V 706 can be applied where indicated, for instance at program_column$_0$, pull down voltage sources, and program_row$_1$. Application of zero voltage at program_row$_1$ deactivates program transistors of memory cells in row$_1$ (the bottom cells, 1-1 602D and 0-1 602C), and isolates pull up resistors of row$_1$ from HV 704 applied at pull up voltage source 624.

Assuming that all RRAM resistors are in an erase state (high resistance state), high voltage HV 704 is applied to program_row$_0$, which is applied directly to program transistor gates of row$_0$, activating those program transistors, and also enables the HV 704 applied at pull up voltage source 620 to be propagated to pull up resistors of row$_0$. Moreover, high voltage HV 704 is applied at program_column$_1$ and zero volts 0V 706 is applied at program_column$_0$. Accordingly, HV 704 is propagated to the common node of the voltage divider in 1-0 cell 602B. The resulting voltage drop across the pull down resistor of 1-0 cell 602B and current 708 in 1-0 cell 602B programs the pull down resistor of 1-0 cell 602B to a low resistance state. In contrast, a low voltage drop (e.g., about zero volts) across both terminals of the pull up resistor maintains the pull up resistor in a current state (its initial erased state), which is the erased state in this example. The high resistance state of the pull up resistor and low resistance state of the pull down resistor deactivates the pass gate transistor of 1-0 cell 602B during normal read operation.

Zero voltage 0V 706 at program column$_0$ is applied at the common node of the voltage divider of 0-0 cell 602A. The resulting voltage drop across the pull up resistor of 0-0 cell 602A and the current 710 in 0-0 cell 602A programs the pull up resistor to low resistance, whereas about zero volts applied to both terminals of the pull down resistor (at pull down source 622 and programming column$_0$ 614) maintains the pull down resistor in the erased state (since all pull down and pull up resistors start in the erased state for the row$_0$ programming operation of FIG. 7) resulting in high resistance for the pull down resistor. High resistance in the pull down resistor and low resistance in the pull up resistor of 0-0 cell 602A activates the pass gate transistor of that cell during normal read operation (e.g., see FIG. 11, infra, for an example read operation), as described herein.

Figure 8:
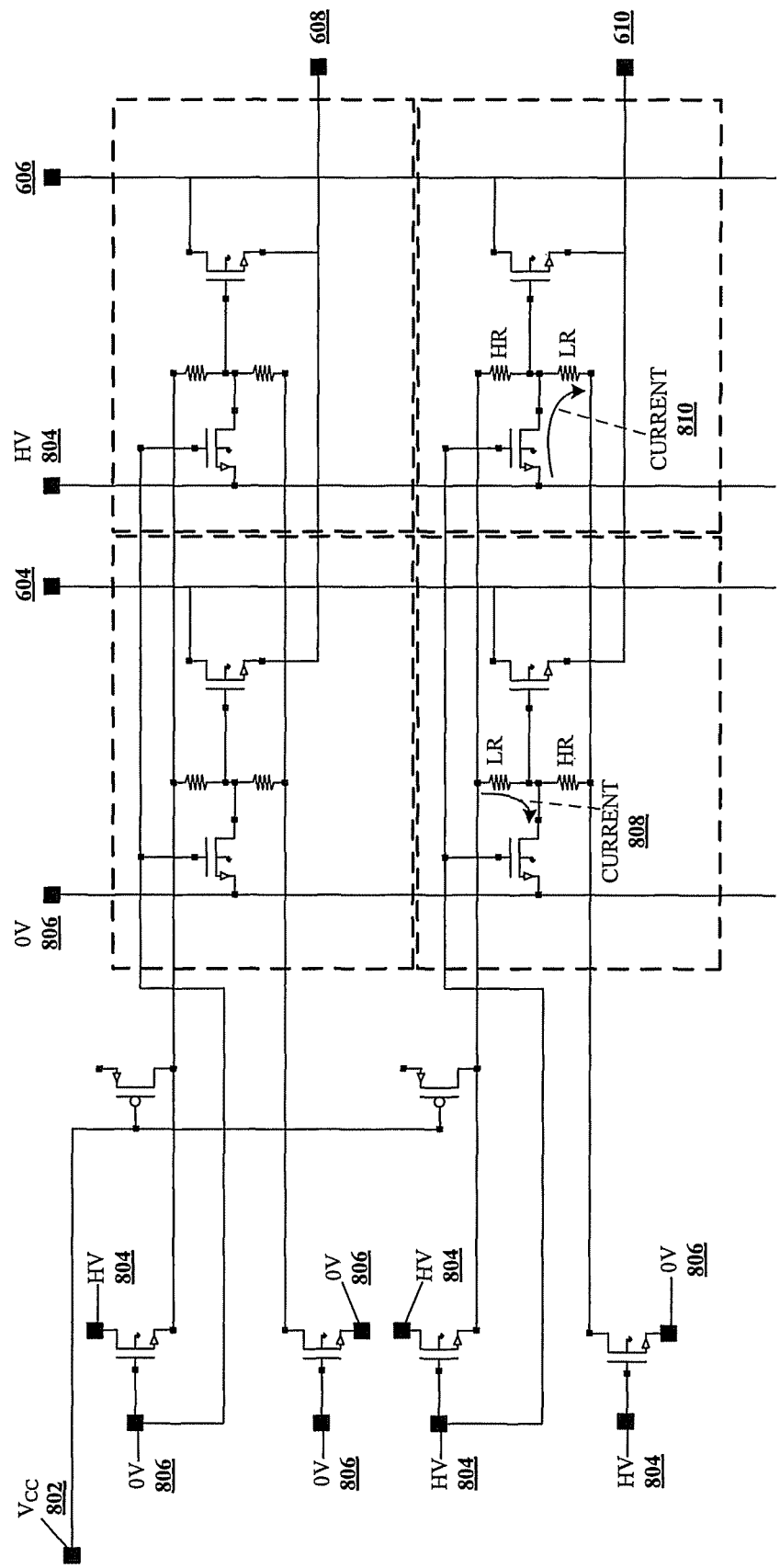
FIG. 8 illustrates a schematic diagram of another sample programming operation for the two-by-two interconnect of FIG. 6 according to another aspect.

FIG. 8 illustrates a sample schematic diagram 800 of an additional row programming operation for programmable switching block 600. Particularly, schematic diagram 800 depicts a row programming operation for row$_1$. For programming row$_1$ 618, V$_{CC}$ 802 is applied to read enable contact 630, which deactivates read-enable PMOS transistors 632. HV 804 is applied to programming_column$_0$ 614, to pull up resistor voltage sources 620 and 624 and pull down activation contact 619 and to programming_row$_1$ 618. About zero volts 0V 806 is applied to pull down resistor voltage sources 622 and 626, pull down activation contact 617, programming_row$_0$ 616 and to programming_column$_1$ 612.

Each RRAM resistor in the respective cells 602C-602D is in an erased state prior to application of the voltages listed in schematic diagram 800. The zero volts 0V 806 applied to programming_row$_0$ 616 deactivates program transistors of row$_0$, resulting in no voltage being driven at common nodes of the voltage dividers of 0-0 cell 602A and 1-0 cell 602B. Moreover, 0V 806 applied to programming row$_0$ 616 deactivates the pull up transistor of row$_0$, such that no voltage is applied to the pull up resistors of row$_0$. Finally, 0V 806 applied at pull down activation source 617 isolates pull down resistors of row$_0$ from pull down source 622. Because no voltage is applied to nodes of the voltage divider, row$_0$ voltage dividers remain unchanged and in their initial erased states or previously programmed state.

With regard to row$_1$, high voltage HV 804 applied to programming_row$_1$ 618 activates program resistors of row$_1$. The program resistor of 1-1 cell 602D transfers 0V 806 to the common node of the voltage divider of 1-1 cell 602D. In addition, HV 804 applied at pull up source 624 results in a voltage drop across the pull up resistor of this cell that is approximately equal to HV 804. This voltage drop and the resulting current 808 of 1-1 cell 602D programs the pull up resistor of 1-1 cell 602D to low resistance. 0V 806 applied at pull down source 626 results in approximately zero volts across the pull down resistor, maintaining the pull down resistor in its initial erased, high resistance state. Because the pull up resistor of 1-1 cell 602D is programmed and the pull down resistor erased, the pass gate transistor of 1-1 cell 602D will be activated during normal read operation (e.g., see FIG. 11, infra).

In contrast, high voltage HV 804 applied at programming_column$_0$ 614 results in HV 804 at the common node of the voltage divider of 0-1 cell 602C. In conjunction with HV 804 at pull up source 624, this results in approximately zero volts across the pull up resistor of 0-1 cell 602C, maintaining this pull up resistor in its existing state (the erased state in this example). The 0V 806 applied at pull down source 626 results in a voltage differential of about HV 804 across the pull down resistor of 0-1 cell 602C, leading to the depicted current 810 of this cell and programming the pull down resistor to low resistance. Moreover, this configuration deactivates the pass gate transistor of 0-1 cell 602C during normal read operation.

Figure 9:
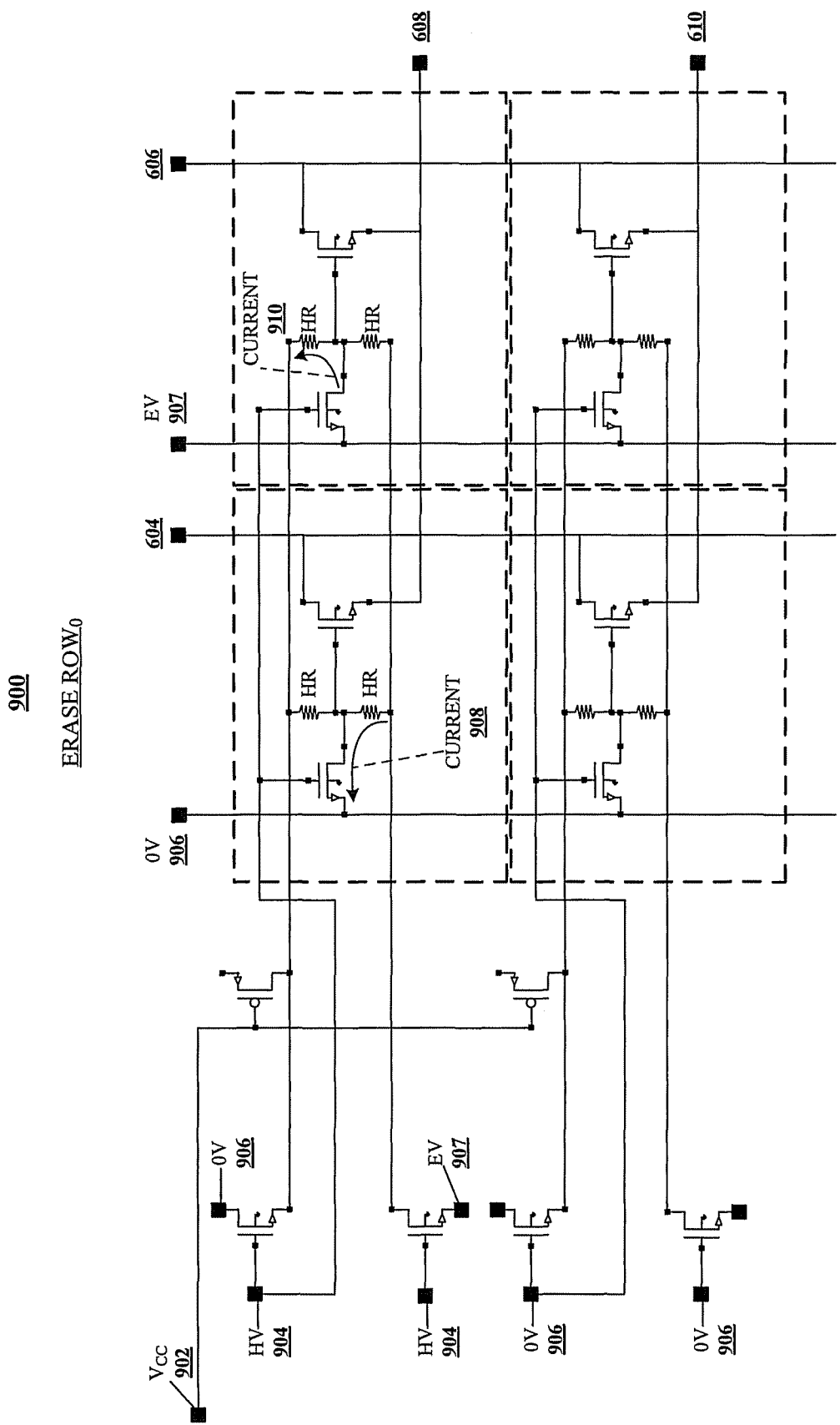
FIG. 9 depicts a schematic diagram of an example erase operation for the two-by-two interconnect of FIG. 6 according to a further aspect.
Figure 10:
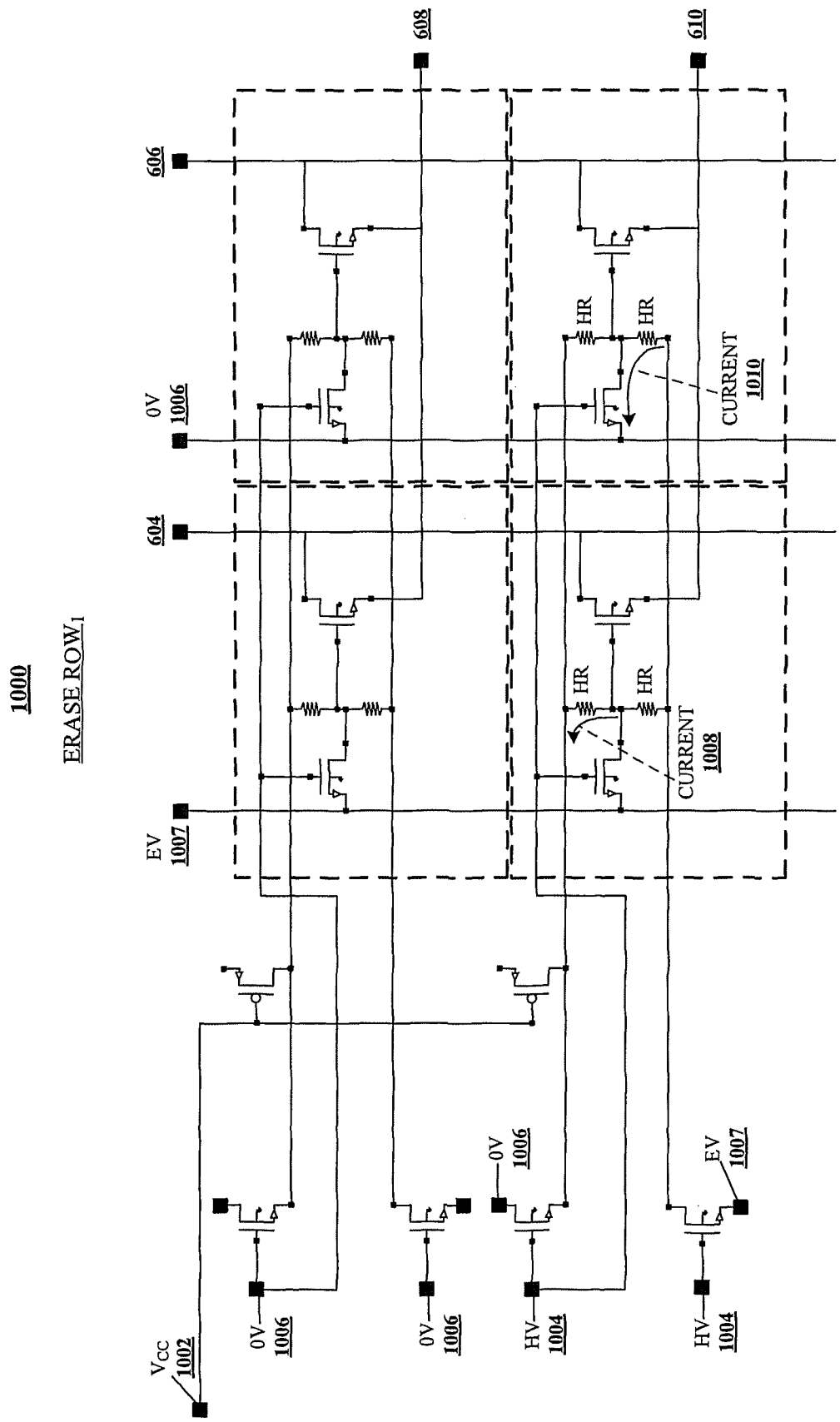
FIG. 10 illustrates a schematic diagram of an additional sample erase operation for the two-by-two interconnect of FIG. 6 according to yet another aspect.

FIG. 9 and FIG. 10 illustrate example schematic diagrams for respective row erase operations 900 and 1000 for programmable switching block 600. Row erase operation 900 illustrates such an operation for row$_0$ following the row$_0$ programming operation of FIG. 7, supra (the pull down resistor and pull up resistor of 1-0 cell 602B are in the program and erase states, respectively, and the pull down resistor and pull up resistor of 0-0 cell 602A are in the erase and program states, respectively). Row erase operation 1000, on the other hand, illustrates a row erase operation for row$_1$ following the row programming operation of row$_1$ depicted in FIG. 8, supra (the pull down resistor and pull up resistor of 0-1 cell 602C are in the program and erase states, respectively, and the pull down resistor and pull up resistor of 1-1 cell 602D are in the erase and program states, respectively).

As depicted, row erase operation 900 includes a V$_{CC}$ 902 applied at read enable contact 630. This deactivates PMOS transistors 632. In addition, an erase voltage EV 907 is applied to pull down voltage source 622 which is activated with HV 904 applied at pull down activation contact 617. Further, HV 904 is applied to programming_row$_0$ 616, while EV 907 is also applied to programming_column$_0$ 614. Approximately zero volts 0V 906 is applied at pull up voltage source 620, pull down activation contact 619, programming_row$_1$ 618, and to programming_column$_1$ 612. As described above, 0V 906 applied at programming_row$_1$ 618 prohibits programmable resistors of row$_1$ from changing state (e.g., maintaining them in respective initial states prior to implementing the erase operation). The programmed pull down resistor of 1-0 cell 602B, is erased by application of EV 907 to the bottom terminal of this pull down resistor and 0V 906 applied to programming_column$_1$ 612. The resulting reverse potential difference across the pull down resistor of 1-0 cell 602B and the reverse current 908 generated in this pull down resistor erases the pull down resistor. The approximately zero volt potential across the pull up resistor of 1-0 cell 602B from 0V 906 at programming_column$_1$ 612 and at pull up voltage source 620 maintains the pull up resistor in its initial erased state.

Erase voltage EV 907 can be a suitable voltage that, in conjunction with a voltage applied to the common node of the voltage divider of 1-0 cell 602B, results in a potential difference across the pull down transistor that erases the pull down transistor to a high resistance state. Thus, EV 907 can vary depending on a type of RRAM technology employed for the pull down resistor (or pull up resistor when erasing the pull up resistor). For unipolar RRAM technology, a suitable positive potential difference distinct from HV 904 is generally employed for erasing the pull down resistor to the high resistance state. For bipolar RRAM technology, a potential difference that can be similar in magnitude to HV 904 but opposite in polarity is generally suitable for erasing the pull down resistor to the high resistance state. Other voltages will be suitable for other RRAM technology, as is known in the art or made known to one of ordinary skill in the art by way of the context provided herein. Such other voltages and RRAM technologies are generally considered within the scope of the subject disclosure.

Regarding 0-0 cell 602A, EV 907 is applied to programming_column$_0$ 614. This results in no significant potential difference across the pull down resistor of 0-0 cell 602A, as the pull down resistor observes the EV 907 at its upper and lower terminals (the latter being applied at pull down voltage source 624 and activated by HV 904 applied at pull down activation source 617). Accordingly, the pull down resistor of 0-0 cell 602A does not change state. The pull up resistor of 0-0 cell 602A, on the other hand, observes 0V 906 at its upper terminal applied at pull up voltage source 620, and EV 907 applied at programming_column$_0$ 614, which causes a reverse current 910 through this pull up resistor, erasing the pull up resistor to the high resistance state. Following erase operation 900, the pull up and pull down resistors of 0-0 cell 602A and 1-0 cell 602B can be in their original factory settings (e.g., erased state).

Turning to row erase operation 1000, $V_{CC}$ 1002 is applied at read enable contact 630 to deactivate PMOS transistors 632, and erase voltage EV 1007 is applied at pull down voltage source 626 which is activated with high voltage HV 1004 applied to pull down activation contact 619. HV 1004 is also applied at programming_row$_1$ 618, while EV 1007 is applied at programming_column$_1$ 612. Approximately zero volts 0V 1006 is applied at pull up voltage source 624 and to pull down activation contact 617, programming_row$_0$ 616 and programming_column$_0$ 614. Row$_0$ program transistors are deactivated, leaving the initial erase states of the voltage dividers of 0-0 cell 602A and 1-0 cell 602B unchanged. HV 1004 at programming_row$_1$ 618 activates program transistors of row$_1$. EV 1007 applied at programming_column$_1$ 612 and at pull down voltage source 626 results in approximately zero voltage differential across the pull down resistor of 1-1 cell 602D, leaving this pull down resistor in its initial erase state. In contrast, 0V 1006 applied at pull up voltage source 624 and the EV 1007 applied at programming column$_1$ 612 results in a potential difference approximately of EV 1007 across the pull up resistor of 1-1 cell 602D and current 1008, erasing this pull up resistor. 1-1 cell 602D is therefore in its initial factory setting after the depicted row erase operation (e.g., the pull up resistor and pull down resistor in the erase state). 0-1 cell 602C observes approximately zero volts at the common node of the pull up and pull down resistors of this cell. Accordingly, approximately zero volts applied at pull up voltage source 624 results in substantially no voltage dropped across the pull up resistor of 0-1 cell 602C, maintaining this resistor in its previous erase state. The EV 1007 applied at pull down voltage source 626 results in a voltage drop across the pull down resistor of 0-1 cell 602C, and the depicted current 1010. The voltage drop and current erases this pull down transistor, leaving the pull up and pull down resistors of 0-1 cell 602C in the erase state (e.g., initial factory setting).

Figure 11:
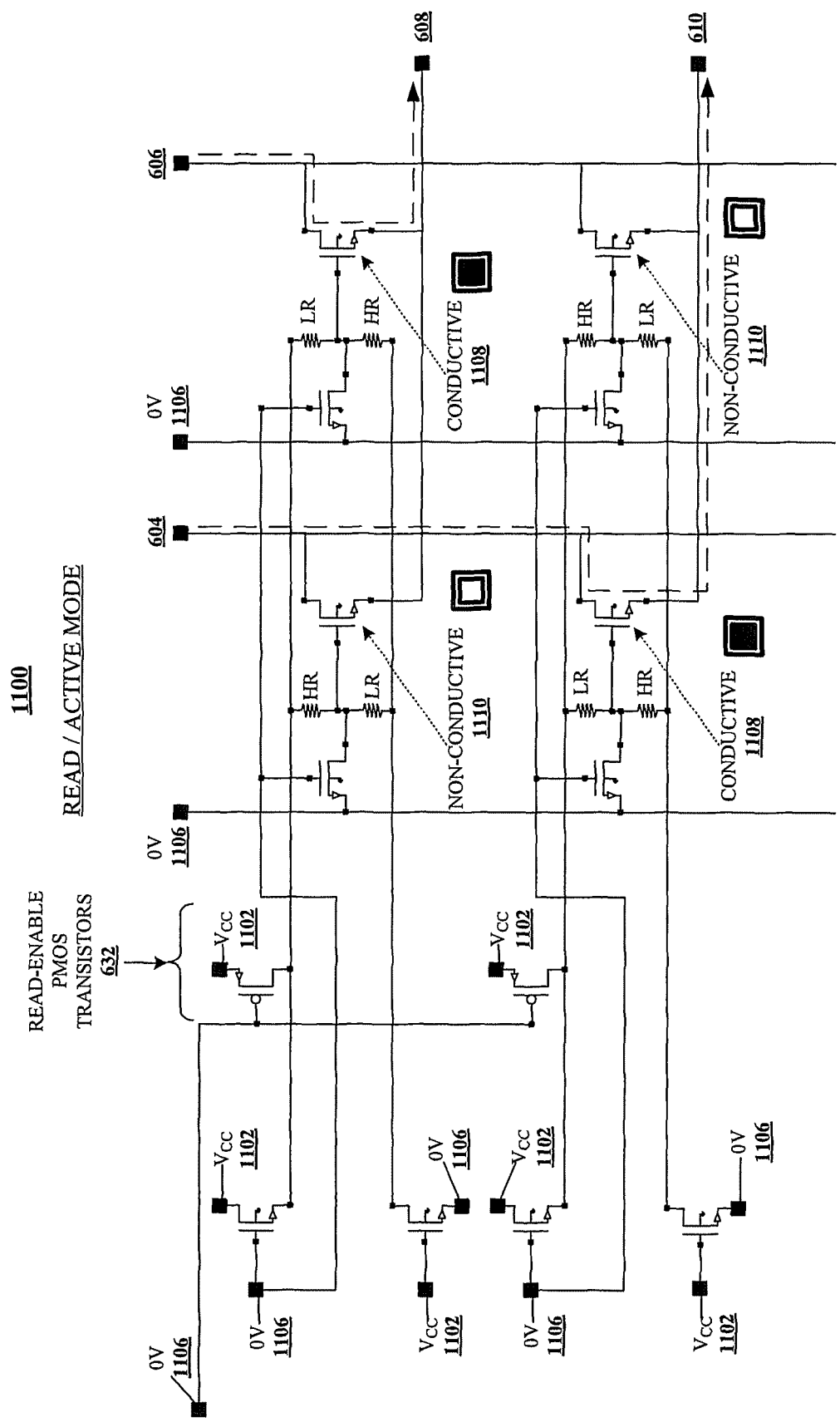
FIG. 11 illustrates a schematic diagram of a sample read/active mode operation for the two-by-two interconnect of FIG. 6 according to additional aspects.

FIG. 11 illustrates a schematic diagram of an example read/active mode operation 1100 for programmable switching block 600 according to one or more further aspects of the subject disclosure. Programmable switching block 600 is in an initial state that corresponds to the programming of row$_0$ and of row$_1$ as described above at FIGS. 7 and 8. Thus, pass gate transistors of 0-0 cell 602A and of 1-1 cell 602D are activated in response to programming of the pull up resistors of these cells. Further, the pass gate transistors of 0-1 cell 602B and 1-0 cell 602C are deactivated in response to programming of the pull down resistors of these cells.

To implement the read operation, $V_{CC}$ 1102 is applied at pull down activation contacts 617 and 619, and as a result the zero volts applied at pull down sources 622 and 626 are transferred to the lower contacts of the pull down resistors of row$_0$ and row$_1$. The pull up transistors are deactivated in response to zero volts being applied at programming_row$_0$ 616 and at programming_row$_1$ 618. However, read-enable PMOS transistors 632 are activated by zero volts applied at read-enable contact 630, and $V_{CC}$ 1102 applied at respective source nodes of read-enable PMOS transistors 632 is therefore observed at the upper contacts of the pull up resistors of row$_0$ and row$_1$. Program transistors of row$_0$ and row$_1$ are deactivated, and thus the respective voltage dividers observe only $V_{CC}$ at the upper contact, and zero volts at the lower contact, maintaining respective pull up and pull down resistors in their existing states.

In response to voltage settings described above, the pass gate transistors of 0-0 cell 602A and 1-1 cell 602D are activated, and in a conductive state 1108, while the pass gate transistors of 1-0 cell 602B and 0-1 cell 602C are deactivated, and in a non-conductive state 1110, as depicted. Accordingly, because 1-1 cell 602D and 0-0 cell 602A are configured to be active, signal input 604 is electrically connected with signal output 610 at 1-1 cell 602D, and signal input 606 is electrically connected with signal output 608 at 0-0 cell 602A. Current flow (in this case, signal current) is depicted by the dashed lines for the connected signal inputs, e.g., from signal input 604 through the pass gate transistor of 1-1 cell 602D, and out signal output 610, and also from signal input 606 through the pass gate transistor of 0-0 cell 602A and out signal output 608. Because 0-1 cell 602C and 1-0 cell 602B are configured to be inactive, signal input 604 is electrically isolated from signal output 608, and signal input 606 is electrically isolated from signal output 610.

In should also be appreciated that in some aspects of the subject disclosure, the programmable switching block of FIG. 11 can have bidirectional signal contacts (e.g., see FIG. 5, supra). Thus, for instance, signal propagation (current flow) through 1-1 cell 602D could be originated at signal output 610 and received at signal input 604, in these aspects. Likewise, signal propagation through 0-0 cell 602A can be initiated at signal output 608 and received at signal input 606, according to these aspects. Accordingly, the example of read/active mode operation 1100 depicted in FIG. 11 should not be construed to limit the direction of signal propagation to that depicted by this example.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of voltage divider component 200, programming circuit component 400, in conjunction with transistor element 102, signal input 110 and signal output 108. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed switching blocks can be programmed or erased in groups (e.g., multiple rows programmed or erased concurrently) or individually. Components of the disclosed architectures can also interact with one or more other components not specifically described herein but known by those of skill in the art.

Figure 12:
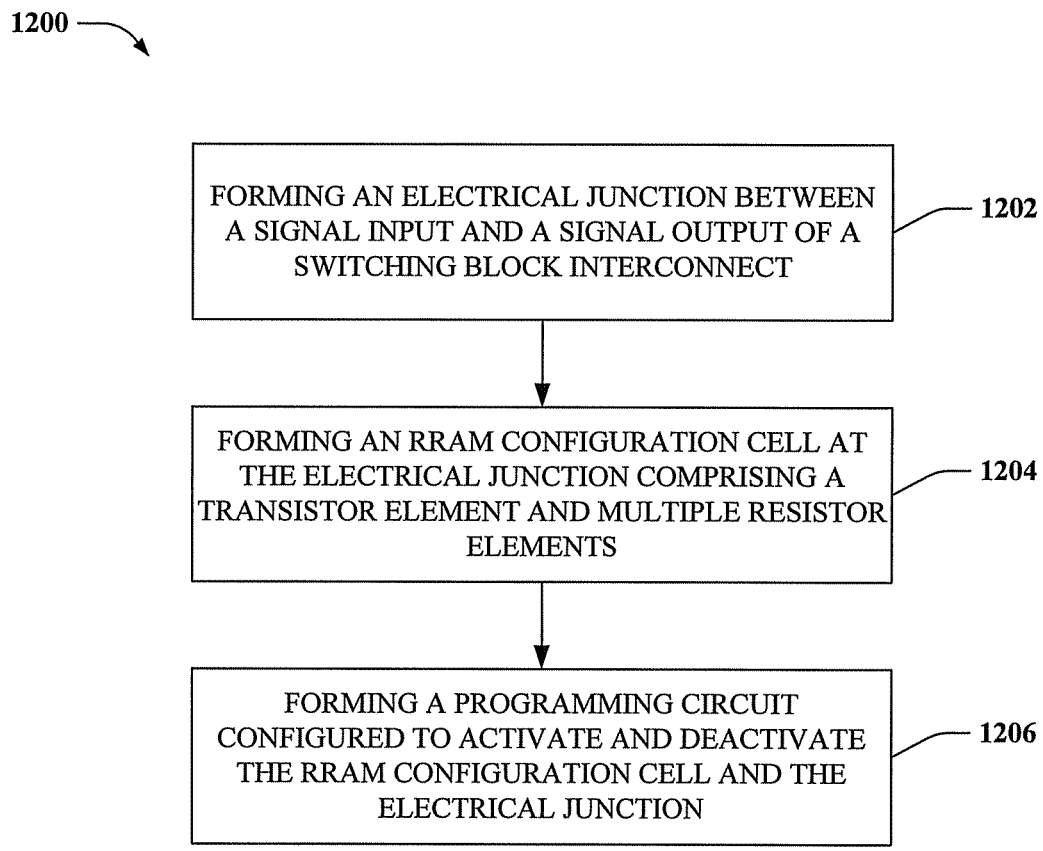
FIG. 12 depicts a flowchart of an example method for fabricating a field programmable gate array (FPGA) utilizing RRAM technology according to some aspects.
Figure 13:
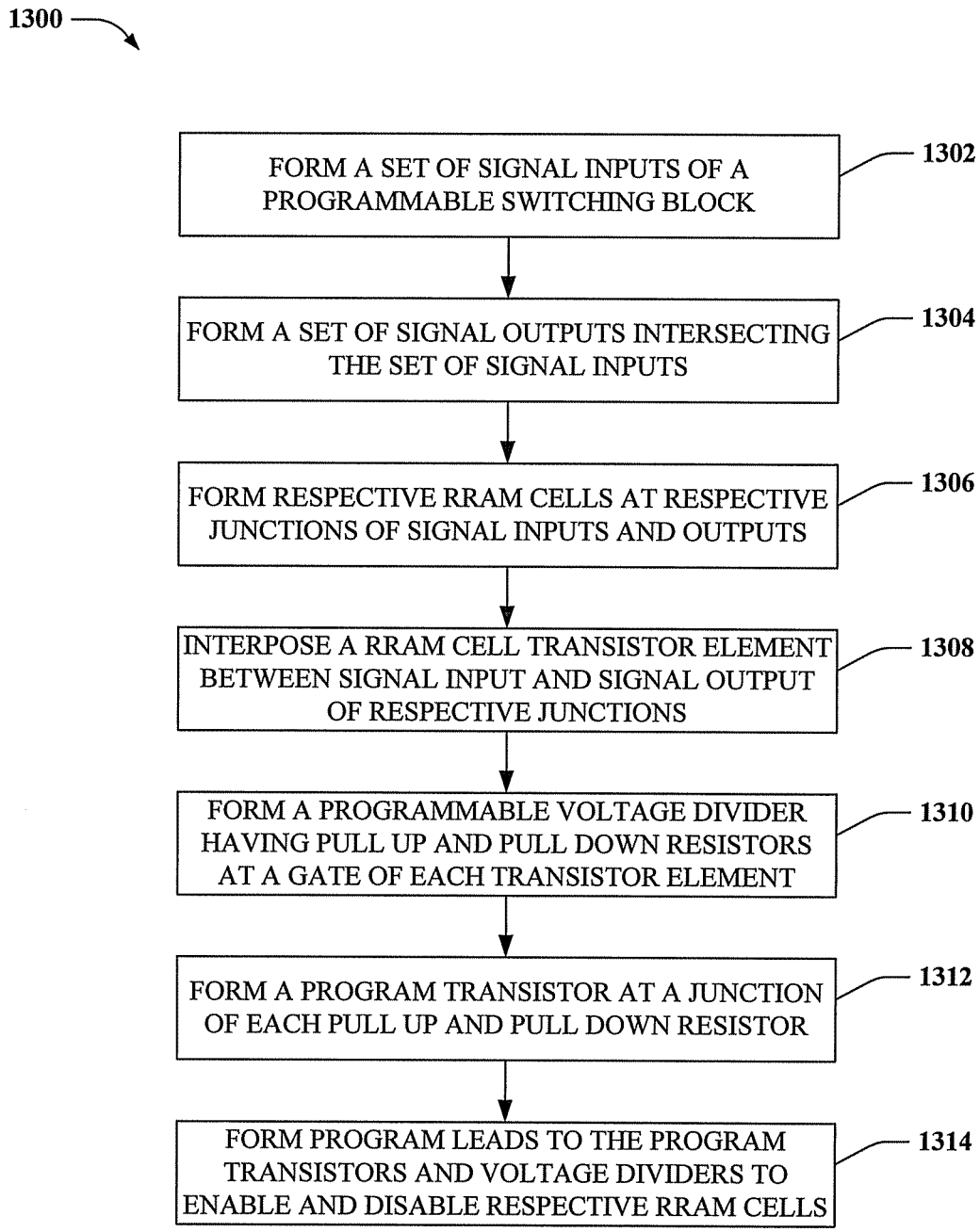
FIG. 13 illustrates a flowchart of a sample method for fabricating a switching block interconnect utilizing RRAM memory in other aspects.

In view of the exemplary diagrams described supra, process methods that can be implemented in accordance with the disclosed subject matter will be better appreciated with reference to the flow charts of FIGS. 12 and 13. While for purposes of simplicity of explanation, the methods 1200, 1300 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 1200, 1300 described hereinafter. Additionally, it should be further appreciated that the methods 1200, 1300 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 12 illustrates a flowchart of an example method 1200 for fabricating a programmable switching block, according to aspects of the subject disclosure. At 1202, method 1200 can comprise forming an electrical junction between a signal input and a signal output of the programmable switching block. At 1204, method 1200 can comprise forming a RRAM cell at the electrical junction. The RRAM cell can comprise a transistor element that physically connects the signal input with the signal output. According to particular aspects of the subject disclosure, the RRAM cell can further comprise multiple programmable resistive elements. In at least one aspect, the multiple programmable resistive elements can form a voltage divider that drives a gate of the transistor element. At 1206, method 1200 can comprise forming a programming circuit configured to activate or deactivate the RRAM cell thereby activating or deactivating the electrical junction, respectively. In at least one aspect, the programming circuit can be formed independent from the signal input and the signal output of the programmable switching block.

FIG. 13 depicts a flowchart of a sample method 1300 for forming a programmable switching block based on RRAM memory cells according to further aspects of the subject disclosure. At 1302, method 1300 can comprise forming a set of signal inputs of the programmable switching block. Further, at 1304, method 1300 can comprise forming a set of signal outputs intersecting the set of signal inputs. At 1306, method 1300 can comprise forming respective RRAM configuration cells at respective junctions of signal inputs and signal outputs of the programmable switching block. At 1308, method 1300 can comprise interposing a transistor element of respective RRAM cells between signal inputs and signal outputs of respective junctions. Moreover, at 1310, method 1300 can comprise forming a programmable voltage divider having programmable pull up and pull down resistors at a gate of each transistor element. At 1312, method 1300 can comprise forming a program transistor at a junction of each pull up or pull down resistor. At 1314, method 1300 can comprise forming program leads to the program transistors and voltage dividers to activate and deactivate respective RRAM configuration cells, thereby controlling configuration of respective junctions of the programmable switching block.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 14:
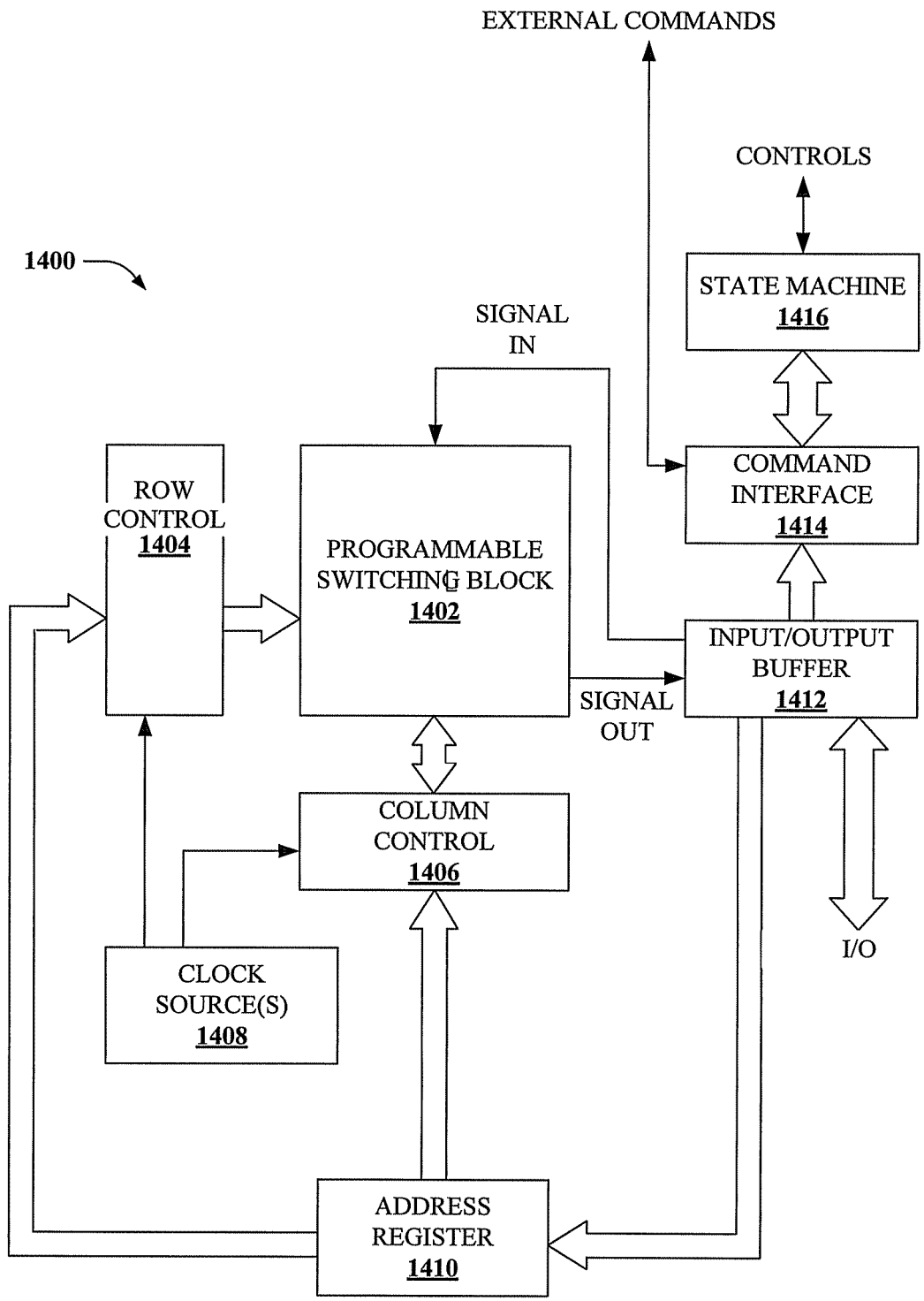
FIG. 14 depicts a block diagram of an example electronic operating environment according to one or more aspects of the subject disclosure.

In order to provide a context for the various aspects of the disclosed subject matter, FIG. 14, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject innovation also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules may be located in both local and remote memory storage modules or devices.

FIG. 14 illustrates a block diagram of an example operating and control environment 1400 for a programmable switching block 1402 according to aspects of the subject disclosure. In at least one aspect of the subject disclosure, programmable switching block 1402 can comprise RRAM memory cell technology. Respective RRAM memory cells can be employed for programming respective input and output signal junctions of programmable switching block 1402, as described herein.

A column controller 1406 can be formed adjacent to programmable switching block 1406. Moreover, column controller 1406 can be electrically coupled with bit lines of programmable switching block 1402. Column controller 1406 can control respective bitlines, applying suitable program, erase or read voltages to selected bitlines.

In addition, operating and control environment 1400 can comprise a row controller 1404. Row controller 1404 can be formed adjacent to programmable switching block 1406, and electrically connected with word lines of programmable switching block 1402. Row controller 1404 can select particular rows of memory cells with a suitable selection voltage. Moreover, row controller 1404 can facilitate program, erase or read operations by applying suitable voltages at selected word lines.

A clock source(s) 1408 can provide respective clock pulses to facilitate timing for read, write, and program operations of row control 1404 and column control 1406. Clock source(s) 1408 can further facilitate selection of word lines or bit lines in response to external or internal commands received by operating and control environment 1400. An input/output buffer 1412 can be connected to an external host apparatus, such as a computer or other processing device (not depicted) by way of an I/O buffer or other I/O communication interface. Input/output buffer 1412 can be configured to receive write data, receive an erase instruction, output readout data, and receive address data and command data, as well as address data for respective instructions. Address data can be transferred to row controller 1404 and column controller 1406 by an address register 1410. In addition, input data is transmitted to programmable switching block 1402 via signal input lines, and output data is received from programmable switching block 1402 via signal output lines. Input data can be received from the host apparatus, and output data can be delivered to the host apparatus via the I/O buffer.

Commands received from the host apparatus can be provided to a command interface 1414. Command interface 1414 can be configured to receive external control signals from the host apparatus, and determine whether data input to the input/output buffer 1412 is write data, a command, or an address. Input commands can be transferred to a state machine 1416.

State machine 1416 can be configured to manage programming and reprogramming of programmable switching block 1402. State machine 1416 receives commands from the host apparatus via input/output interface 1412 and command interface 1414, and manages read, write, erase, data input, data output, and like functionality associated with programmable switching block 1402. In some aspects, state machine 1416 can send and receive acknowledgments and negative acknowledgments regarding successful receipt or execution of various commands.

To implement read, write, erase, input, output, etc., functionality, state machine 1416 can control clock source(s) 1408. Control of clock source(s) 1408 can cause output pulses configured to facilitate row controller 1404 and column controller 1406 implementing the particular functionality. Output pulses can be transferred to selected bit lines by column controller 1406, for instance, or word lines by row controller 1404, for instance.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A field programmable gate array (FPGA), comprising:
a switching block routing array comprised of a set of signal inputs and a set of signal outputs;
a transistor element having a first terminal connected to one of the set of signal inputs and a second terminal connected to one of the set of signal outputs;
a plurality of resistive elements comprising a first resistive element and a second resistive element configured to be dynamically programmed to activate or deactivate the transistor element;
a shared node connected to a second terminal of the first resistive element, connected to a first terminal of the second resistive element, and connected to a gate of the transistor element; and
a programming circuit having an output contact exclusive to the shared node of the first resistive element and the second resistive element and electrically connected to the shared node via a path that is independent of the first resistive element and the second resistive element, wherein a voltage applied by the output contact at the shared node facilitates dynamic programming of the first resistive element or the second resistive element.

2. The FPGA of claim 1, wherein the transistor element enables current flow between the one of the set of signal inputs and the one of the set of signal outputs when activated by the plurality of resistive elements.

3. The FPGA of claim 1, wherein the transistor element resists current flow between the one of the set of signal inputs and the one of the set of signal outputs when deactivated by the plurality of resistive elements.

4. The FPGA of claim 1, wherein the plurality of resistive elements form a voltage divider.

5. The FPGA of claim 4, wherein a state of the voltage divider is controlled by at least one of:
- a first voltage applied at a first terminal of the first resistive element and a program voltage applied by the output contact of the programming circuit;
- a second voltage applied to a second terminal of the second resistive element and the program voltage applied by the output contact of the programming circuit; or
- a combination of the first voltage applied at the first terminal of the first resistive element, the second voltage applied to the second terminal of the second resistive element and the program voltage applied by the output contact of the programming circuit.

6. The FPGA of claim 4, wherein the first resistive element of the voltage divider comprises a pull up resistor having a first programmable resistance.

7. The FPGA of claim 6, wherein the second resistive element of the voltage divider comprises a pull down resistor having a second programmable resistance.

8. The FPGA of claim 7, wherein the first programmable resistance or the second programmable resistance can be programmed or erased, respectively, to a first resistance value or a second resistance value, the first resistance value being smaller than the second resistance value.

9. The FPGA of claim 8, wherein the first programmable resistance is programmed to the first resistance value when the second programmable resistance is erased to the second resistance value, and vice versa.

10. The FPGA of claim 8, wherein the first programmable resistance is erased to the second resistance value when the second programmable resistance is programmed to the first resistance value.

11. The FPGA of claim 8, wherein the first resistance value is at least about one hundred times smaller than the second resistance value.

12. The FPGA of claim 8, wherein the first resistance value is at least about one thousand times smaller than the second resistance value.

13. The FPGA of claim 8, wherein the first resistance value is at least about ten thousand times smaller than the second resistance value.

14. The FPGA of claim 6, wherein the transistor element is in a conductive state when the pull up resistor is programmed and the pull down resistor is erased, and the transistor element is in a non-conductive state when the pull up resistor is erased and the pull down resistor is programmed.

15. The FPGA of claim 1, wherein the transistor element and the plurality of resistive elements combine to be about $11F^2$ in area, where F is a minimum feature size dimension of a process technology used to manufacture the FPGA.

16. The FPGA of claim 1, wherein the transistor element is configured to enable a signal current to propagate bi-directionally through the junction, either from one of the set of signal inputs to one of the set of signal outputs, or from the one of the set of signal outputs to the one of the set of signal inputs, or a combination thereof.

17. The FPGA of claim 16, wherein the signal current propagates through the junction without propagating through the plurality of resistive elements.

18. The FPGA of claim 1, wherein the first resistive element and the second resistive element have substantially the same program voltage.

19. A method of fabricating a field programmable gate array (FPGA), comprising:
- forming an electrical junction between a signal input and a signal output;
- forming a configuration cell at the electrical junction comprising one or more transistor elements and multiple resistive elements, wherein the one or more transistor elements physically connects the signal input with the signal output;
- forming a programming circuit configured to output a program voltage at a program voltage output and configured to deactivate a program switch of the programming circuit and isolate the program voltage output from the program voltage; and
- connecting the program voltage output directly to a common node shared by the multiple resistive elements, wherein the program voltage is configured in part to program or deprogram respective ones of the multiple resistive elements via a direct path from the program voltage output of the programming circuit to the common node, to activate or deactivate the configuration cell.

20. An electronic configuration memory device, comprising:
- a switching block interconnect including a plurality of switches coupled to a set of signal inputs and a set of signal outputs, wherein the plurality of switches are configured to couple a subset of the set of signal inputs to a subset of the set of signal outputs respectively in response to one or more control signal inputs; and
- a set of programmable resistive random access memory (RRAM) configuration cells connected to the switching block interconnect, wherein at least one of the set of RRAM configuration cells is exclusive to one of the plurality of switches and comprises a first resistive element and a second resistive element that form a programmable voltage divider having a programmable voltage divider output, wherein the programmable voltage divider output can be programmed at least in part by a program signal applied via a programming path independent of the first resistive element and the second resistive element to a common node of the programmable voltage divider.

* * * * *